United States Patent
Greene et al.

(10) Patent No.: US 11,360,252 B2
(45) Date of Patent: Jun. 14, 2022

(54) PARTIALLY-REFLECTIVE COVER FOR A SMART HOME DEVICE

(71) Applicant: Google LLC, Mountain View, CA (US)

(72) Inventors: Leslie Greene, San Mateo, CA (US); Ranhee Chung, San Jose, CA (US); Sung Kyun Bai, San Jose, CA (US); William Dong, Redwood City, CA (US); Maj Isabelle Olsson, Sunnyvale, CA (US); Liana Kong, Redwood City, CA (US); Justin Wodrich, Los Gatos, CA (US); Prathik Muppidi, Cupertino, CA (US); Dongkyu Lee, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/108,919

(22) Filed: Dec. 1, 2020

(65) Prior Publication Data
US 2022/0066078 A1    Mar. 3, 2022

Related U.S. Application Data

(63) Continuation-in-part of application No. 17/005,666, filed on Aug. 28, 2020.

(51) Int. Cl.
*G02B 5/28*    (2006.01)
*H05B 47/11*    (2020.01)
(Continued)

(52) U.S. Cl.
CPC ............... *G02B 5/285* (2013.01); *B32B 7/12* (2013.01); *B32B 17/10018* (2013.01);
(Continued)

(58) Field of Classification Search
CPC .......... G02B 5/285; H05B 47/11; B32B 7/12; B32B 17/10018; B32B 17/10935;
(Continued)

(56) References Cited

U.S. PATENT DOCUMENTS 5,076,673 A * 12/1991 Lynam ................. G02F 1/153
                                                        359/275
6,726,112 B1    4/2004 Ho
(Continued)

FOREIGN PATENT DOCUMENTS

KR    20210106798 A * 8/2021 ............. B32B 27/36

OTHER PUBLICATIONS

International Search Report and Written Opinion for PCT/US2021/047693 dated Jan. 14, 2022, all pages.

*Primary Examiner* — Mark Edwards
(74) *Attorney, Agent, or Firm* — Kilpatrick Townsend & Stockton LLP

(57) ABSTRACT

Various embodiments of smart devices are determined herein. A smart device can include a housing and an electronic display. The smart device can further include a cover, housed by the housing, through which the electronic display is visible. The cover can include a glass layer, wherein the glass layer is the outermost layer of the cover that is adjacent an ambient environment of the smart home device. The cover can further include an optical coating layer, deposited directly onto a surface of the glass layer, that comprises a plurality of sublayers. The optical coating layer can include alternating non-metallic oxide layers having different refractive indexes. The sublayers can vary in thickness such that the optical coating layer reflects light from the ambient environment through the glass layer.

20 Claims, 19 Drawing Sheets

(51) Int. Cl.
  *C03C 17/34* (2006.01)
  *B32B 37/12* (2006.01)
  *B32B 7/12* (2006.01)
  *B32B 17/10* (2006.01)
  *G05D 23/27* (2006.01)
  *H05K 5/03* (2006.01)

(52) U.S. Cl.
  CPC ........ *B32B 17/10935* (2013.01); *B32B 37/12* (2013.01); *C03C 17/3417* (2013.01); *G05D 23/27* (2013.01); *H05B 47/11* (2020.01); *H05K 5/03* (2013.01); *B32B 2255/20* (2013.01); *B32B 2255/28* (2013.01); *B32B 2307/402* (2013.01); *B32B 2307/412* (2013.01); *B32B 2307/416* (2013.01); *B32B 2315/08* (2013.01); *B32B 2457/20* (2013.01); *C03C 2217/734* (2013.01); *C03C 2218/15* (2013.01)

(58) Field of Classification Search
  CPC . B32B 37/12; B32B 2255/20; B32B 2255/28; B32B 2307/402; B32B 2307/412; B32B 2307/416; B32B 2315/08; C03C 2218/15; G05D 23/27; H05K 5/03
  USPC .......................................................... 361/600
  See application file for complete search history.

(56) References Cited

U.S. PATENT DOCUMENTS

| | | | |
|---|---|---|---|
| 2009/0033676 A1* | 2/2009 | Cybart | G09G 3/2003 345/589 |
| 2012/0068854 A1 | 3/2012 | Shiflet et al. | |
| 2013/0082951 A1 | 4/2013 | Tanaka et al. | |
| 2015/0159895 A1 | 6/2015 | Quam et al. | |
| 2015/0160633 A1* | 6/2015 | Adami | G05B 15/02 362/555 |
| 2016/0054022 A1 | 2/2016 | Matas et al. | |
| 2017/0017359 A1 | 1/2017 | Choi et al. | |
| 2017/0060150 A1 | 3/2017 | Stefanski et al. | |
| 2017/0212615 A1 | 7/2017 | Watanabe et al. | |
| 2018/0059809 A1 | 3/2018 | McClendon et al. | |
| 2019/0079236 A1* | 3/2019 | Hung | G02B 5/3083 |
| 2019/0187489 A1* | 6/2019 | Valentine | G02C 7/104 |
| 2019/0229410 A1 | 7/2019 | Hung et al. | |
| 2020/0082790 A1* | 3/2020 | Moore | G09G 5/10 |
| 2021/0150873 A1 | 5/2021 | Shouldice et al. | |

* cited by examiner

PARTIALLY-REFLECTIVE COVER FOR A SMART HOME DEVICE

CROSS REFERENCE TO RELATED APPLICATION

This Application is a continuation-in-part of and claims priority to U.S. patent application Ser. No. 17/005,666, filed Aug. 28, 2020, entitled "Thermostat Control Using Touch Sensor Gesture Based Input," the entire disclosure of which is hereby incorporated by reference for all purposes.

BACKGROUND

A thermostat is used to control the operation of a heating system, cooling system, or both. Users can benefit from using a smart thermostat that can communicate via a wireless network with a cloud-based server. Such wireless network connectivity can allow for the thermostat to be controlled remotely by a user, such as via an application executed on a user's mobile device. The more straightforward and easy to interact with a smart thermostat is, the more likely users will desire to interact with the smart thermostat and take advantage of its features.

SUMMARY

Arrangements detailed herein are focused on smart home devices, such as smart thermostats. A smart home device can include a housing and a wireless network interface housed by the housing. The device can further include an electronic display, housed by the housing, that outputs a plurality of colors. The device can further include a processing system comprising one or more processors housed by the housing. The device can further include a cover, housed by the housing, through which the electronic display is visible. The cover can include a glass layer, wherein the glass layer is the outermost layer of the cover that is adjacent an ambient environment of the smart home device. The cover can include an optical coating layer, deposited directly onto a surface of the glass layer, that comprises a plurality of sublayers. The optical coating layer can include alternating non-metallic oxide layers having different refractive indexes. The plurality of sublayers can vary in thickness such that the optical coating layer reflects light incident on the optical coating layer from the ambient environment through the glass layer at a first plurality of wavelengths. The optical coating layer can permit a second plurality of wavelengths of light to be transmitted.

Embodiments of such a smart home device can include one or more of the following features: The cover can include an optically clear adhesive layer directly attached to the optical coating layer. The cover can include an anti-shatter layer directly attached to the optical coating layer. In response to an impact that breaks the glass layer, the anti-shatter layer can hold pieces of the glass layer together. The optical coating layer can include less than fifteen non-metallic sublayers. A thickness of each sublayer of the plurality of sublayers of the optical coating layer can be between 10 nm and 110 nm. The device can include an ambient light sensor, housed by the housing, that receives light from the ambient environment through the cover. The processing system can be configured to adjust a brightness of the electronic display based on an amount of ambient light sensed by the ambient light sensor through the cover and a stored ambient light tint correction profile. The stored ambient light tint correction profile may be selected from a plurality of stored ambient light tint correction profiles based upon a tint of the cover. The smart home device may be a thermostat and the thermostat further can include one or more temperature sensors, housed by the housing, in communication with the processing system. The cover can include a masking layer adjacent an interior of the smart home device. The masking layer is shaped to allow light emitted by the electronic display to pass through the cover and block light from being reflected by other components of the smart home device from passing through the cover. The device can include a non-transitory processor-readable medium that stores a display color settings profile that corresponds to a tint of the cover, wherein the processing system adjusts color output by the electronic display based on the display color settings profile.

In some embodiments, a method for manufacturing a cover for a smart home device is presented. The method can include performing a vapor deposition process to deposit an optical coating layer directly onto a glass layer. The optical coating layer can include a plurality of sublayers. The plurality of sublayers can vary in thickness and refractive indexes such that the optical coating layer reflects light at a plurality of wavelengths incident on the cover from the ambient environment. The method can include bonding an anti-shatter layer with an optically clear adhesive layer. The method can include attaching the bonded anti-shatter layer and optically clear adhesive layer with the deposited optical coating layer. The method can also include installing the cover within a housing of the smart home device.

Embodiments of such a method may include one or more of the following features: The method can include attaching a masking layer with the bonded anti-shatter layer, wherein the masking layer is shaped to allow light emitted by an electronic display of the smart home device to pass through the cover and prevent light from being reflected back through the cover by other components of the smart home device. The optical coating layer can include alternating oxide layers having different refractive indexes. The optical coating layer can include less than fifteen sublayers. A thickness of each sublayer of the plurality of sublayers of the optical coating layer can be between 10 nm and 110 nm.

In some embodiments, a smart home device is present. The device can include a housing, a wireless network interface housed by the housing, an electronic display, housed by the housing, that outputs a plurality of colors, and a processing system comprising one or more processors housed by the housing, wherein the processing system is in communication with the wireless network interface and the electronic display. The device can further include a cover, housed by the housing, through which the electronic display is visible. The cover can include a glass layer, wherein the glass layer is the outermost layer of the cover that is adjacent an ambient environment of the smart home device. The cover can include a transparent colored film. The cover can include a mirrored film, directly attached with the transparent colored film, that comprises a plurality of sublayers. The transparent colored film can be located between the glass layer and the mirrored film. The plurality of sublayers can vary in thickness and refractive indexes such that the mirrored film reflects light at a plurality of wavelengths incident on the cover from the ambient environment. The transparent colored film can function as an anti-shatter film. The anti-shatter film holds pieces of the glass layer together in response to an impact that breaks the glass layer. The transparent colored film can be rose tinted or nickel tinted. The cover can include an optically clear adhesive layer than bonds the transparent colored film with the glass layer. The device can include an ambient light sensor, housed by the housing, that receives light from the ambient environment through the cover. The processing system can be configured to adjust a brightness of the electronic display based on an amount of ambient light sensed by the ambient light sensor through the cover and a predefined ambient light tint correction profile. The predefined ambient light tint correction profile can be selected from a plurality of predefined ambient light tint correction profiles based upon a tint of the transparent colored film. The device can be a thermostat and the thermostat further comprises one or more temperature sensors, housed by the housing, in communication with the processing system.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

A smart thermostat refers to a thermostat that can communicate via a network and allows a user to interact with the smart thermostat from a remote location, such as via a mobile device (e.g., smartphone, tablet computer, desktop computer, laptop computer, etc.). Additionally or alternatively, a smart thermostat has advanced features such as sensing as to whether any persons are in the vicinity of the smart thermostat and adjusting a setpoint temperature of the thermostat based on the sensed occupancy.

When a smart thermostat is installed, such as in a user's home, the user may desire that the smart thermostat be relatively easy to interact with and is also aesthetically pleasing. Embodiments detailed herein are directed to smart thermostats that can include a touch strip that is used by the user to provide input directly to the smart thermostat. In some embodiments, the touch strip is the only user interface present on the smart thermostat. Additionally, the user can interact with the thermostat via an application executed on a mobile device.

The smart thermostat may have a partially-reflective cover installed on a face of the thermostat. The cover may have a mirrored effect such that at least some light incident from the ambient environment upon the cover is reflected back into the ambient environment. When the electronic display is turned off, the mirrored cover may have the visual effect of appearing to be a mirror to a user viewing the face of the thermostat. When the electronic display is illuminated, the mirrored cover has a sufficient transmissivity to allow the illuminated portion of the electronic display to be viewed by the user through the cover. In some embodiments, the cover does not have any cutouts, holes, lenses, or variations on the front surface that could be visible to the user.

Additionally, the partially-transparent cover may have multiple layers that function to increase the cover's resistance to scratching, breaking, or shattering into pieces. The cover can have sufficient transmissivity that portions of an electronic display that are illuminated can be seen through the cover. However, portions of the electronic display that are not illuminated, such as an edge of the electronic device, cannot easily be seen by a user through the partially-reflective cover.

The smart thermostat may have a radar sensor. The radar sensor may sense the ambient environment of the smart thermostat through the cover. The cover may use one or more ceramic oxide layers to achieve reflectivity rather than using any metallic layers. In some embodiments, no metallic layer is present within the cover. The lack of a metallic layer can help increase the transmissivity for electromagnetic radiation (or radio waves) emitted by the radar sensor and received by the radar sensor through the cover.

Figure 1:
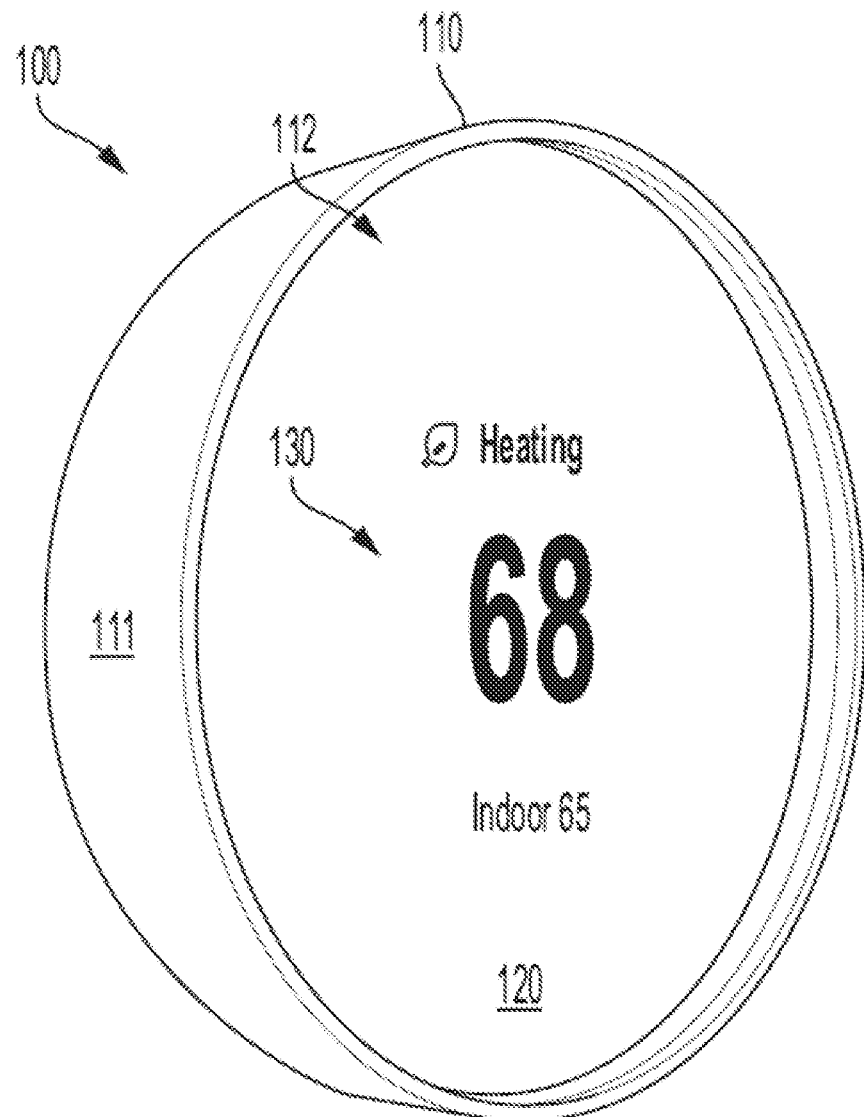
FIG. 1 illustrates an embodiment of a smart thermostat with an electronic display presenting information.

Further detail regarding the smart thermostat is provided in relation to the figures. FIG. 1 illustrates an embodiment of a smart thermostat 100 with an electronic display presenting information. As visible in FIG. 1, housing 110, cover 120, and a portion of an illuminated electronic display 130 ("display 130") can be seen.

Housing 110 defines rounded aperture 112, such as a circular aperture, in which cover 120 may be attached with housing 110. Housing 110 includes sidewall 111. In the illustrated embodiment, sidewall 111 is generally cylindrical. Around an axis perpendicular to cover 120, a radius of sidewall 111 may be greater at front of housing 110 where cover 120 is housed and smaller toward a back of housing 110.

Cover 120 is housed by housing 110 such that within aperture 112 cover 120 is visible when the front of smart thermostat 100 is viewed. Cover 120 can have a reflectivity such that when display 130 is not illuminated, cover 120 appears to be a mirror when viewed by a user.

Display 130 is housed behind cover 120 such that, when illuminated, the portion of display 130 that is illuminated is visible through cover 120 by a user. In some embodiments, due to the reflectivity of cover 120, an edge of display 130 is not visible to a user regardless of whether display 130 is illuminated, partially illuminated, or not illuminated. Therefore, the overall effect experienced by a user may be that cover 120 appears as a mirror and portions of display 130, when illuminated, are visible through cover 120.

In some embodiments, display 130 is not a touch screen. Therefore, in such embodiments, a user is required to use another user interface to interact with smart thermostat 100. The user may use an application executed by a mobile device to interact with the thermostat via a wireless network or a direct wireless connection (e.g., Bluetooth). A user interface, such as a capacitive touch strip, may be present on smart thermostat 100. In some embodiments, the capacitive touch strip is the only user interface present on smart thermostat through which a user can interact with presented menus, icons, and other data presented on display 130. Further, in some embodiments, no user interface present on smart thermostat 100 has any moving parts. When smart thermostat 100 is fully installed, no components may be accessible or visible to the user that are movable.

Figure 2:
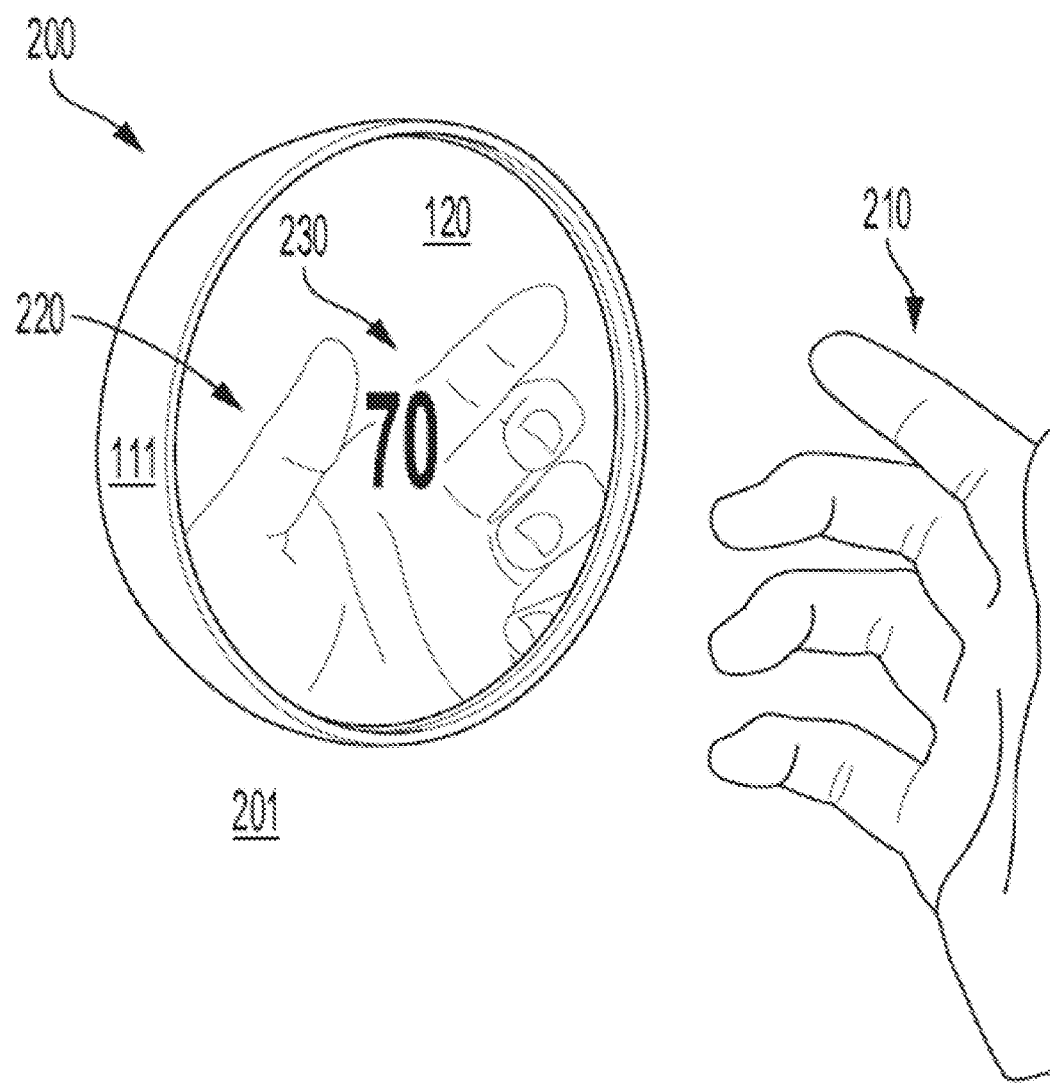
FIG. 2 illustrates an embodiment of a user's hand being present near thermostat that is mounted to a wall.

FIG. 2 illustrates an embodiment 200 of a user's hand being present near thermostat 100 that is mounted to wall 201. In embodiment 200, cover 120 is sufficiently reflective that a reflection 220 of user's hand 210 is visible. Cover 120 has a sufficient transmissivity that temperature 230, as presented by display 130 through cover 120, is also visible. To calculate transmittance, a perception weighted average can be used. In some embodiments, such as those in which cover 120 appears to have a "silver" tint, transmissivity may be 29%. For other colors, such as when cover 120 has a "rose" or "nickel" tint, transmissivity may be 22% and 18.6% respectively. In other embodiments, transmissivity may be between 15% and 55%. Reflectivity may be between 75% and 40% depending on embodiment.

As can be seen in embodiment 200, except for portions of display 130 that are illuminated, cover 120 appears as an uninterrupted surface with no gaps, holes, lens, or other discontinuities present on cover 120.

Figure 3A:
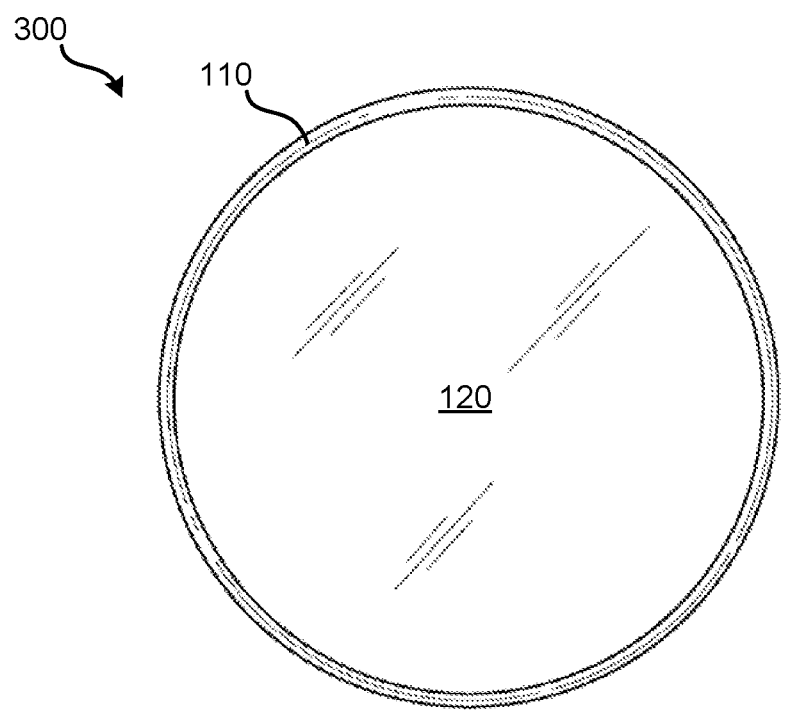
FIG. 3A illustrates an embodiment of a smart thermostat as viewed from the front.

FIG. 3A illustrates an embodiment of a smart thermostat 300 as viewed from the front. When mounted on a wall or other surface, cover 120 is opposite the portion of thermostat 300 that mounts to the wall or other surface. Therefore, when a user is facing mounted thermostat 300, cover 120 is visible.

Smart thermostat 300 can represent an embodiment of thermostat 100 of FIGS. 1 and 2. Housing 110 can define a rounded aperture in which cover 120 is located. In some embodiments, housing 110 defines a circular aperture in which cover 120 is located. In such embodiments, cover 120 can be circular. As previously detailed, cover 120 can form an uninterrupted surface with no gaps, holes, lens, or other discontinuities present on cover 120. Cover 120 has sufficient transmissivity to allow light emitted by electronic display 130 located within housing 110 to be visible through cover 120. Cover 120 can have sufficient reflectivity such that a mirrored effect is present on portions of cover 120 that are not currently being illuminated from behind by electronic display 130. Notably, in some embodiments, it is not possible for a user to view where an edge of electronic display 130 is through cover 120 due to the reflectivity of cover 120.

Figure 3B:
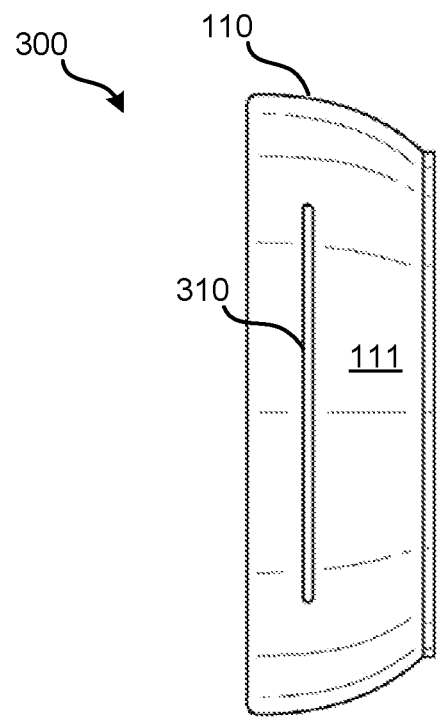
FIG. 3B illustrates an embodiment of a smart thermostat as viewed from the right.

FIG. 3B illustrates an embodiment of a smart thermostat 300 as viewed from the right. Thermostat 300 can represent thermostat 100 of FIG. 1. When thermostat 300 is mounted to a wall or other surface, touch strip indicator 310 may be visible on the right side of sidewall 111. Touch strip indicator 310 may be a visible indicator, such as a line, shading, or some form of shape or marking that serves as a visible indicator as to where a user can touch sidewall 111 to provide user input. Within housing 110, on an inner side of the sidewall opposite touch strip indicator 310, can be a touch strip that can detect one or more types of gestures performed by a user on or near touch strip indicator 310. For example, a user can perform a tap gesture (touch and release), a swipe gesture (e.g., swipe upward along touch strip indicator 310, swipe downward along touch strip indicator 310), or a long hold gesture (touch and hold for at least a threshold amount of time).

The touch strip may be capacitive and, through sidewall 111 of housing 110, a user's touch against sidewall 111 can be detected. Touch strip indicator 310 may serve to indicate to a user the region in which the user's touch is sensed. Any gesture performed significantly away from touch strip indicator 310 may be unlikely to be sensed by the touch strip. The touch strip located within housing 110 may represent the only user input component present on thermostat 300 through which a user can directly provide input to thermostat 300. Additionally, a user may use an application or website executed on another computerized device to interact with thermostat 300.

The tactile sensation when a user moves his finger over touch strip indicator 310 might be no different than sidewall 111. Alternatively, touch strip indicator 310 may have a variance in protrusion or texture from sidewall 111 so that a user can determine the location of touch strip indicator 310 by touch. For instance, a multi-layer (e.g., 4 layer) pad print may be performed to create touch strip indicator 310 such that a subtle protrusion of touch strip indicator 310 is present. Such an arrangement may be beneficial when interacting with thermostat 300 in a darkened environment.

In the embodiment of thermostat 300, touch strip indicator 310 and the corresponding touch strip are located on a right side of thermostat 300 when viewed from the front (such as seen in FIG. 3). In other embodiments, the touch strip and corresponding touch strip indicator 310 may be present on a top, bottom, or left of sidewall 111. In some embodiments, multiple touch strips may be present, such as on the left and right of sidewall 111.

Figure 4A:
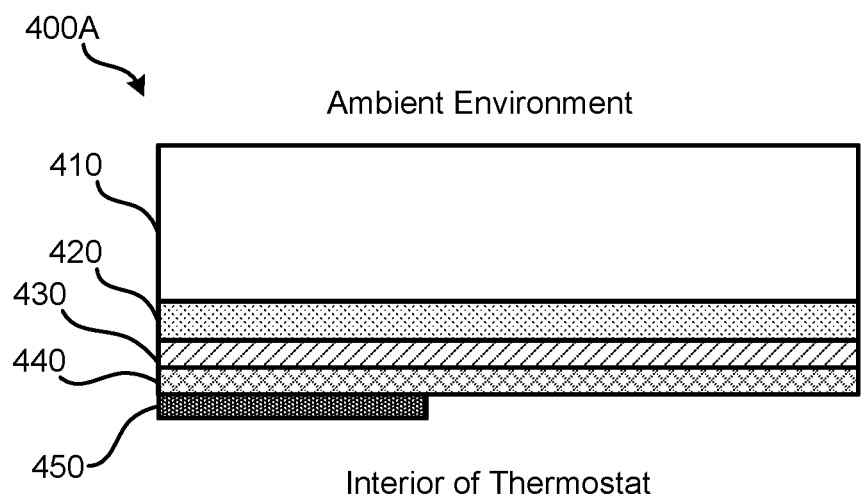
FIG. 4A illustrates an embodiment of a layer stack of a partially-reflective cover.

FIG. 4A illustrates an embodiment 400A of a layer stack of a partially-reflective cover. The thicknesses indicated in FIG. 4A are not to scale. While embodiments of such a reflective cover may be used on a thermostat or smart thermostat, embodiments of such a reflective cover may be used on other forms of smart home devices and, more generally, smart devices. For instance, other smart home devices and smart devices can include: home automation hub devices; active picture frames; tablet computers; home assistant devices; smart home alarm systems; smart televisions; smart irrigation controllers; smart watches; mobile devices; smartphones; etc.

The partially-reflective cover may benefit from having certain properties, such as: being non-metallic to reduce interference with wireless signals of the one or more wireless interfaces (e.g., a WiFi interface) and sensors (e.g., a radar sensor) on-board the device; being scratch resistant due to a potentially significant amount of incidental contact with objects and users; being unlikely to break, such as due to a drop; and being unlikely to produce dangerous shards of glass if broken. Some or all of these properties may be desirable while maintaining a visually-attractive design, such as by appearing to be a mirror or tinted mirror. As previously noted, the partially-reflective cover can cover an electronic display housed by the smart device. When a portion of the electronic display is illuminated, the portion is visible by a user through the partially-reflective cover. When a portion of the electronic display is not illuminated, the user sees a reflection from the ambient environment, thereby exhibiting a mirrored effect.

Embodiment 400A can represent the layers of cover 120. An outermost glass layer 410 may be present. Glass layer 410 may serve as a scratch-resistant transparent layer. Glass layer 410 may be 1.1 mm thick; in other embodiments, glass layer 410 may be between 0.8 mm and 2 mm thick. In some embodiments, the thickness of glass layer 410 was selected to be similar to a vanity mirror that a user may have installed in a bathroom or bedroom. By not using a reflective coating or layer adjacent the ambient environment, small scratches or other physical wear that occurs on glass layer 410 might not significantly affect reflectivity, transmissivity, and/or the aesthetic properties of the cover. Glass layer 410 may be soda lime glass. Additionally or alternatively, glass layer 410 may undergo a chemical strengthening process, such as an ion exchange process. The ion exchange process may strengthen glass layer 410 to make it more resistant to cracking or breakage. The ion exchange process may also strengthen glass layer 410 to make it harder, and thus less likely to scratch. In some embodiments, glass layer may be 1.1 mm thick; in other embodiments it may be between 0.7-3 mm thick. A moderate thickness, such as 1.1 mm, may help give the appearance of the cover being a "vanity" mirror, when the display is not illuminated.

Adjacent glass layer 410 may be optical coating layer 420. By optical coating layer 420 being immediately adjacent glass layer 410, the mirrored effect produced by optical coating layer 420 may be substantially free of any haze or abnormalities that could be introduced if any additional layer was present between glass layer 410 and optical coating layer 420. Optical coating layer 420 may include multiple sublayers of dielectric coatings that create an interference pattern. Sublayers may alternate between having relatively low and relatively high refractive indexes. In some embodiments, the sublayers may alternate between layers of $SiO_2$ and $TiO_2$. In some embodiments, the oxide layers may be nonmetallic to help decrease interference with wireless signals, such as those of the one or more wireless interfaces of the device and/or RF signals emitted and received by the radar sensor. Other dielectric materials that are used for optical coatings and anti-reflective coatings may alternatively be used. A total thickness of optical coating layer 420 may be 1.5 μm. In other embodiments, the total thickness of optical coating layer 420 is between 1 μm and 2 μm. In still other embodiments, the total thickness of optical coating layer 420 is less than 1 μm or greater than 2 μm. Optical coating layer 420 may be formed by performing a physical vapor deposition process on an inner surface of glass layer 410. Optical coating layer 420 may be formed using various non-metallic coatings. Non-metallic coatings may serve to interfere less with radio waves emitted by the radar sensor or reflected by objects and are desired to be measured by the radar sensor. Such non-metallic coatings can include coatings such as $TiO_2$, $SiO_2$, $NB_2O_5$. A total of fewer than 10 or 15 sublayers may be present, such as 14 layers. For example, Table 1 lists ranges of thicknesses that may be used for the sublayers of optical coating layer 420.

TABLE 1

| Material | Thickness |
| --- | --- |
| Oxide A | 10-30 nm |
| Oxide B | 90-110 nm |
| Oxide A | 70-90 nm |
| Oxide B | 90-100 nm |
| Oxide A | 60-80 nm |
| Oxide B | 10-30 nm |
| Oxide A | 70-90 nm |
| Oxide B | 80-100 nm |
| Oxide A | 40-60 nm |
| Oxide B | 70-91 nm |
| Oxide A | 30-50 nm |
| Oxide B | 80-100 nm |
| Oxide A | 30-50 nm |
| Oxide B | 20-30 nm |

While Table 1 illustrates various oxides having alternating relatively high and low refractive indexes, it should be understand that the thicknesses of layers may vary, such as between 10 nm to 510 nm. Further, the total number of layers may vary based on embodiment. The refractive index of the relatively high refractive material may be between 2.5 and 3.8 for the visible light spectrum; the refractive index of the relatively low refractive material may be between 1.3 and 1.6 for the visible light spectrum. In some embodiments, "Oxide A" of Table 1 may be $SiO_2$ and have a refractive index of 1.45 and "Oxide B" may be $TiO_2$ and have a refractive index of between 2.8 and 3.5 in the visible light spectrum. $NB_2O_5$, if used, may have a refractive index of approximately 2.2.

By alternating layers of oxides having different thicknesses and refractive indexes, particular wavelengths of light incident on the cover from the ambient environment may be reflected (due to interference reflection) back into the ambient environment. The greater the wavelength of the light incident upon the cover varies from the wavelength optimized for reflection, the less the light will be reflected and the more the light will be transmitted. Therefore, since the sublayers are designed to cause particular wavelengths to be reflected to a greater degree than other wavelengths, optical coating layer 420 can give the appearance of the cover having a particular tint. For instance, based upon the wavelengths that are reflected to a greater degree than other wavelengths, the cover may have a silver tint to it. Other wavelengths of light may be fully or partially transmitted by optical coating layer 420. Therefore, optical coating layer 420 is partially reflective and partially transparent.

Optically-clear adhesive (OCA) layer 430 can serve to adhere optical coating layer 420 to anti-shatter film 440. OCA layer 430 is transparent and relatively thin. While ideally OCA layer 430 is perfectly transparent, a small amount of haze may be introduced by OCA layer 430, which may at least be in part due to imperfections in OCA layer 430 attaching with optical coating layer 420 and attaching with anti-shatter film 440. In some embodiments, an acrylic-type OCA layer may be used, which may be 25 um in thickness. In other embodiments, the acrylic-type OCA layer may be between 15 um and 40 um in thickness.

Anti-shatter film 440 may serve to prevent the cover from shattering into potentially dangerous pieces if glass layer 410 is impacted by an object with sufficient force. Particularly, anti-shatter film 440, by being attached by OCA layer 430 to optical coating layer 420 and glass layer 410, can hold pieces of glass layer 410 together. In some embodiments, a triacetate cellulose anti-shatter film may be used, which may be 100 um in thickness. In other embodiments, the triacetate cellulose anti-shatter film layer may be between 50 um and 200 um in thickness.

Masking layer 450, where present on the cover, may serve to help prevent any light internal to the smart device from being transmitted through the cover into the ambient environment or from light entering the smart device through the cover and being reflected back into the ambient environment. Masking layer 450 may help enhance the effect that the mirror display is seamless. A color value for masking layer 450 may be selected, having an appropriate lightness value, such that it is difficult or impossible for a user to visually see an edge of the electronic display screen within the smart device. By obscuring an edge of the edge of the electronic display, a user may have the impression that then entire region behind the cover is the electronic display. The lightness value selected for masking layer 450 may be based at least in part on the reflective properties of optical coating layer 420. In some embodiments, an acrylic-type ink is used as masking layer 450, which may be about 5 um in thickness. In other embodiments, the acrylic ink may be between 3 um and 7 um in thickness.

Figure 4B:
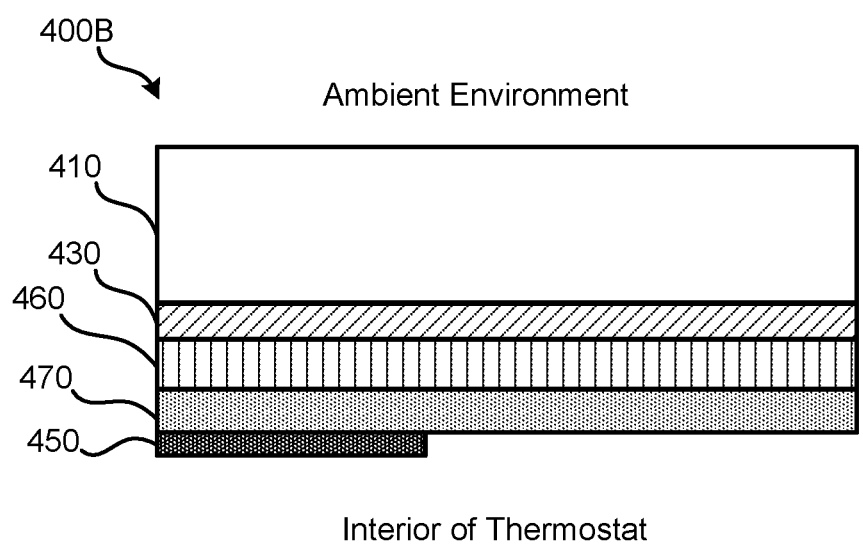
FIG. 4B illustrates another embodiment of a layer stack of a partially-reflective cover.

Embodiment 400A may generally have a neutral or silver tint to it. In other embodiments, a colored tint may be desirable, such as for aesthetic reasons. FIG. 4B illustrates embodiment 400B of a layer stack of a reflective cover. The thicknesses indicated in FIG. 4B are not to scale. For example, a rose or pink tinted cover may be desirable or a nickel tinted cover may be desirable. Embodiment 400B may include: glass layer 410; OCA layer 430; coloring layer 460; mirror film 470; and masking layer 450. Glass layer 410, OCA layer 430, and masking layer 450 may function as detailed in relation to embodiment 400A.

In embodiment 400B, OCA layer 430 may be used to attach glass layer 410 with coloring layer 460. In order for the cover to appear tinted, coloring layer 460 may be located between glass layer 410 and mirror film 470. OCA layer 430 may be an acrylic type OCA that is applied directly to the mirror film, such as in the form of a liquid and then partially cured. In some embodiments, a thickness of 30 um for OCA layer 430 may be used. In other embodiments, the thickness may be between 10 um and 50 um. A balance can be struck between application of OCA layer 430 causing dimpling due to too thin of an OCA application and a wavy visual effect caused by too thick of an OCA application).

Coloring layer 460 may include a particular coloring, dye, or tinting that filters visible light to provide a particular visual tint, such as rose, nickel, or some other color. The thickness of coloring layer 460 may be about 5 um. In other embodiments, the thickness may be between 3 um and 7 um.

Mirror film 470 may include multiple sublayers of polymers that create an interference pattern. A total thickness of mirror film 470 may be between 80 μm and 200 μm in thickness. Mirror film 470 may use polyethylene terephthalate (PET) within the sublayers. Such sublayers may be non-metallic. Non-metallic coatings may serve to interfere less with radio waves emitted by the radar sensor or reflected by objects and are desired to be measured by the radar sensor. Mirror film 470 may include more than one hundred sublayers that are on the order nanometers in thickness; in some embodiments, a thousand layers or more are present. Composition of the sublayers are differentiated by applying differing amounts of strain to the sublayers in order to induce differences in the index of refraction. Some wavelengths of light may be fully or partially reflected by mirror film 470 while other wavelengths of light may be fully or partially transmitted by mirror film 470. Therefore, mirror film 470 is partially reflective and partially transparent.

For aesthetic reasons, mirror film 470 may be preferable when used in combination with coloring layer 460, such as when a coloring of rose or nickel is desired. If a silver or neutral appearance is desired, optical coating layer 420, as used in embodiment 400A may be preferable.

An L (lightness) value of masking layer 450 may be adjusted based on the tint of coloring layer 460. The L value may be selected for masking layer 450 to ensure that masking layer 450 adequately hides an edge of the electronic display housed by the smart device. Other coloring values of masking layer 450 may be kept the same across different embodiments.

Since embodiments 400A and 400B may allow different wavelengths of light to penetrate due to the aforementioned differences in design between embodiments 400A and 400B and tinting differences in the coloring layer 460 of embodiment 400B, various embodiments may use different predefined ambient light tint correction profiles. The predefined ambient light tint correction profile may be used for adjusting the amount of light measured using an ambient light sensor (that measures the amount of ambient light in the ambient environment through the cover of the smart device). The amount of light measured by the ambient light sensor may need to be corrected to adjust for the tint and/or partial reflectance of the cover such that a brightness of the electronic display can be adjusted properly. Ideally, the brightness of the electronic display may be set such that the brightness of the electronic display, as viewed by a user through the cover, appears to approximately match the brightness of objects within the ambient environment of the smart device.

A different ambient light tint correction profile may be created for variations of embodiment 400A and embodiment 400B. Each ambient light tint correction profile may map an electronic display brightness level with a measured ambient light level. Therefore, multiple ambient light tint correction profiles may be created. Only the ambient light tint correction profile that is to be used for a particular smart device may be stored by the smart device. In some embodiments, multiple ambient light tint correction profiles are loaded and stored by the smart device, but only a single ambient light tint correction profile that corresponds to the tint or type of cover may be activated.

In some embodiments, color settings of the electronic display may be set to compensate for the tint of the cover. Therefore, based on the embodiment and/or colored tint of the cover, the color settings of the electronic display may be varied. From a user's point of view, when viewing the electronic display through the cover, the colors of the electronic display may appear neutral and unaffected by any tint of the cover. Therefore, multiple display color settings profiles (which each can define a red, green, and blue color adjustment) may be created and the appropriate display color settings profile may be activated on the smart device that corresponds to the type of cover and/or tint of the cover. Only the display color setting profile that is to be used for a particular smart device may be stored by the smart device. In some embodiments, multiple display color setting profiles are loaded and stored by the smart device, but only a single display color setting profile that corresponds to the tint or type of cover may be activated and used for controlling the color output by the electronic display.

Figure 21:
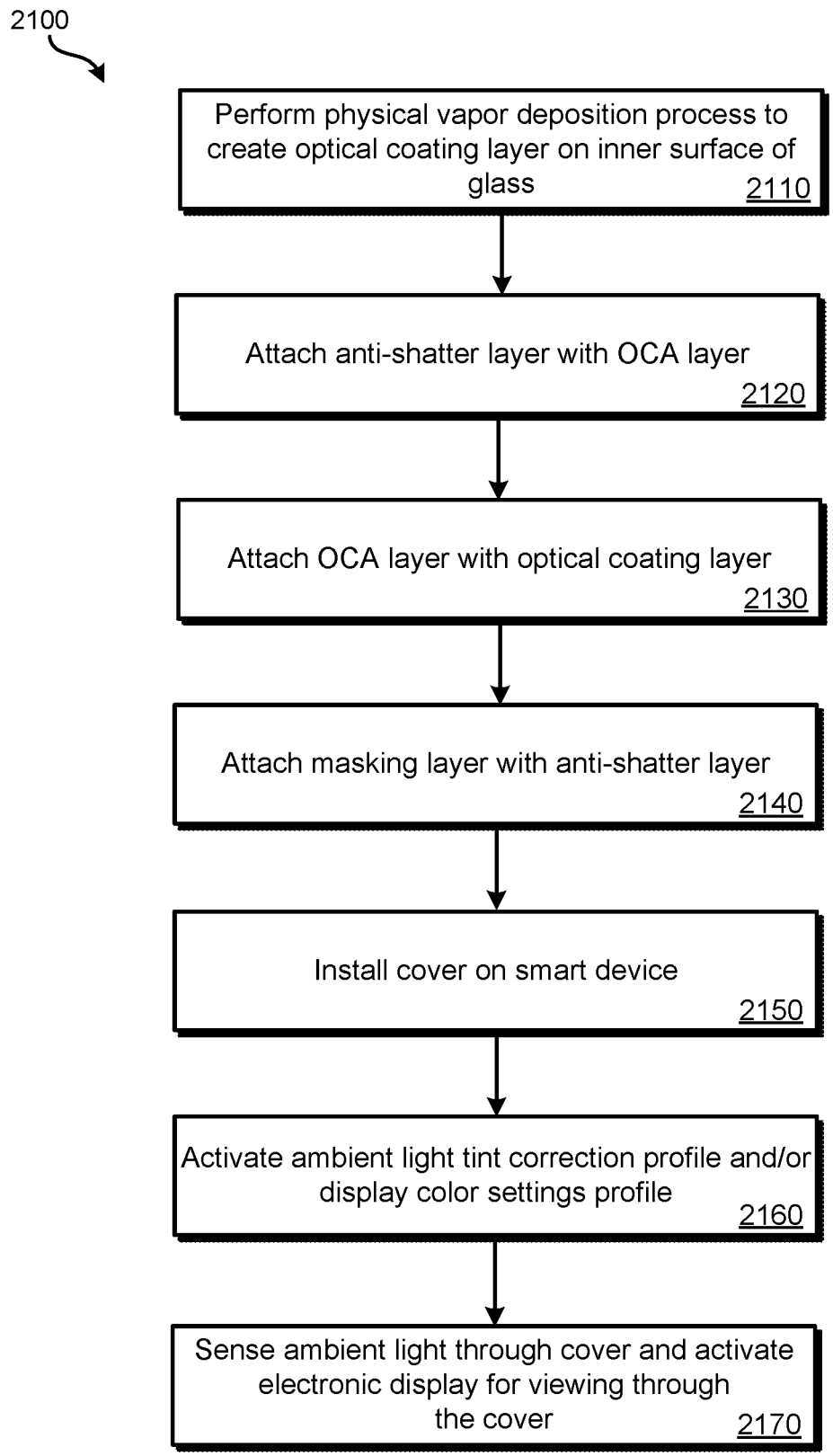
FIG. 21 illustrates an embodiment of a method for manufacturing and using a partially-reflective cover for a smart device.

Various methods for manufacturing and using the embodiments of covers detailed in relation to FIGS. 4A and 4B may be used. FIG. 21 illustrates an embodiment of method 2100 for manufacturing a cover for a smart device. Method 2100 may be used to create embodiment 400A of FIG. 4A and use such a cover as part of a smart device, such as a thermostat.

At block 2110, a physical vapor deposition (PVD) process may be performed to create an optical coating layer directly on an inner surface of the glass layer. The outer surface of the glass layer will be in contact with the ambient environment. The PVD process may be used to deposit alternating layers of different thicknesses and refractive indexes to partially reflect light based on the principle of interference reflection. The outer surface of the glass layer may be on an outside of the smart device and may this come in contact with the ambient environment and objects in such environment (e.g., incidental or intentional touching by a user). Therefore, the optical coating layer may be protected from the ambient environment by being behind the glass layer as detailed in relation to FIG. 4A. The physical vapor deposition process may deposit each sublayer of non-metallic oxide within the optical coating layer onto the glass layer as detailed in relation to optical coating layer 420.

At block 2120, an OCA layer may be affixed or otherwise attached with an anti-shatter layer. These two layers may be joined together prior to being attached with the optical coating layer present on the glass. In some embodiments, a masking layer may also be attached with the anti-shatter layer prior to being attached with the optical coating layer present on the glass.

At block 2130, The OCA layer may be affixed or otherwise attached with the optical coating layer. If the masking layer has not yet been affixed or attached with the anti-shatter layer, at block 2140, the masking layer may be attached with the anti-shatter layer, such as by a printing process that deposits ink as the masking layer onto the anti-shatter layer.

At block 2150, the cover may be installed on a smart device. The cover may be attached with a housing of the smart device, such as housing 110 of thermostat 100. The cover may be free of lenses, holes, or other forms of openings. Therefore, sensors and displays within the smart device, such as light sensors, radar sensors, wireless interfaces, and electronic displays may transmit and/or receive RF (including visible light) through the cover.

At block 2160, an ambient light tint correction profile may be stored and activated on the smart device. The ambient light tint correction profile may be selected from multiple ambient light tint correction profiles based upon a tint of the cover. For example, if three different tinted versions of the cover are made, a different ambient light tint correction profile may be used for each version. The ambient light tint correction profile may contain a mapping of ambient light values to display brightness values that are used to be used to illuminate the electronic display. Specifically, the activated ambient light tint correction profile may correspond to the embodiment of the cover that uses an optical coating layer directly attached with the glass layer as detailed in relation to FIG. 4A. Other ambient light tint correction profiles may correspond to other embodiments of covers, such as those detailed in relation to FIG. 4B. In some embodiments, a non-transitory processor-readable medium of the smart device stores multiple ambient light tint correction profiles, but only the ambient light tint correction profile that corresponds to the tint of the cover of the smart device is activated.

Additionally or alternatively, a display color settings profile may be installed on and activated on the smart device. The display color settings profile partially controls the colors output by the electronic display, when active. The display color settings profile can help counteract the tinting of the cover such that when the electronic display is viewed by a user through the cover, the colors viewed by the user through the cover do not appear affected or appear less affected by the tinting of the cover. The display color settings profile may be selected from multiple display color settings profiles based upon the tint version of the cover. The display color settings profile may contain color value settings that are used to adjust the colors output by the electronic display. For the example of method 2100, the display color settings profile activated can correspond to the embodiment of the cover that uses an optical coating layer directly attached with the glass layer. Other display color value settings profiles that are not activated may correspond to other embodiments of tinted covers, such as those detailed in relation to FIG. 4B. In some embodiments, a non-transitory processor-readable medium of the smart device stores multiple display color value settings profiles, but only the display color value settings profile that corresponds to the optical coating layer embodiment of FIG. 4A is activated.

At block 2170, ambient light may be sensed by an ambient light sensor of the smart device through the cover. A brightness of the electronic display, visible by users through the cover, may be controlled based on the ambient light measurement sensed by the ambient light sensor and the active ambient light tint correction profile that corresponds to the tinting of the cover. Further, color output by the electronic display device may be adjusted based on the activated display color settings profile that is active on the smart device.

Figure 22:
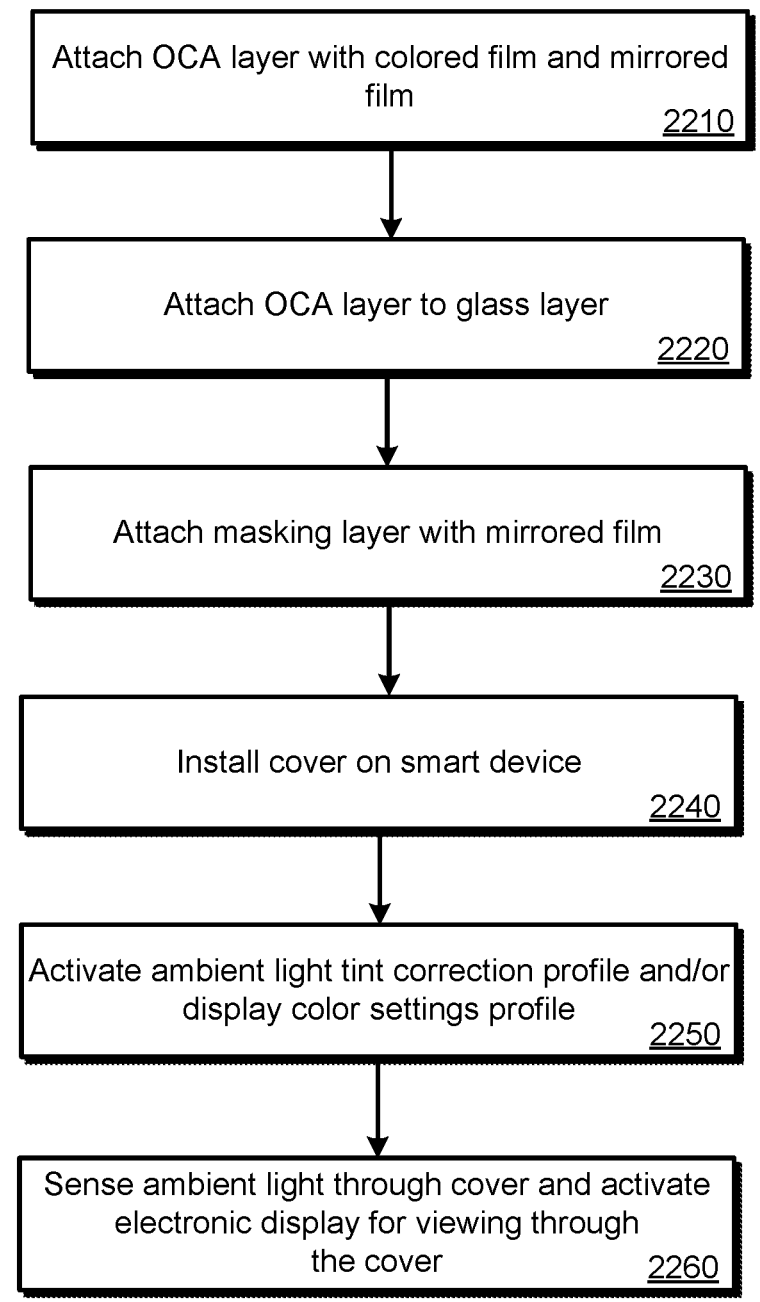
FIG. 22 illustrates another embodiment of a method for manufacturing a partially-reflective cover for a smart device.

FIG. 22 illustrates an embodiment of method 2200 for manufacturing a cover for a smart device. Method 2200 may be used to create embodiment 400B of FIG. 4B and use such a cover as part of a smart device, such as a thermostat. Method 2200 can involve use of a colored film that can be tinted in a variety of colors. A manufacturer may select multiple colors to use for tinting for this colored film such that the cover of the smart device is offered in different tint colors.

At block 2210, an OCA layer may be affixed or otherwise attached with a colored film. These two layers may be joined together prior to being attached with the glass layer. At block 2220, the OCA layer may then be affixed or otherwise attached with the lass layer. Alternatively, the OCA layer may be first attached with the glass then an opposite side of the OCA layer may be attached with the colored film.

At block 2230, a masking layer may be affixed to the mirrored film. In some embodiments, prior to the masking layer being attached with the mirrored film, the mirrored film is attached with the colored film, either before or after the colored film is secured to the glass layer by the OCA layer.

At block 2240, the cover may be installed on a smart device. The cover may be free of lenses, holes, or other forms of openings. Therefore, sensors and displays within the smart device, such as light sensors, radar sensors, wireless interfaces, and electronic displays may transmit and/or receive RF (including visible light) through the cover.

At block 2250, an ambient light tint correction profile may be stored and activated on the smart device. The ambient light tint correction profile may be selected from multiple ambient light tint correction profiles based upon a tint of the colored film of the cover. For example, if three different tinted versions of the cover are made, a different ambient light tint correction profile may be used for each version. The ambient light tint correction profile may contain a mapping of ambient light values to display brightness values that are used to be used to illuminate the electronic display. Specifically, the activated ambient light tint correction profile may correspond to the embodiment of the cover that uses a specifically-colored film as detailed in relation to FIG. 4B. For instance, referring to other embodiments in this document, different profiles may be used for a "rose" tinted version and a "nickel" tinted version. In some embodiments, a non-transitory processor-readable medium of the smart device stores multiple ambient light tint correction profiles, but only the ambient light tint correction profile that corresponds to the tint of the cover of the smart device is activated.

Additionally or alternatively, a display color settings profile may be installed on and activated on the smart device. The display color settings profile partially controls the colors output by the electronic display, when active. The display color settings profile can help counteract the tinting of the cover such that when the electronic display is viewed by a user through the cover, the colors viewed by the user through the cover do not appear affected or appear less affected by the tinting of the cover. The display color settings profile may be selected from multiple display color settings profiles based upon the tint version of the colored film of the cover. The display color settings profile may contain color value settings that are used to adjust the colors output by the electronic display. For the example of method 2200, the display color settings profile activated can correspond to the specific color of the colored film. Other display color value settings profiles that are not activated may correspond to other embodiments of tinted covers, such as the embodiment of FIG. 4A. In some embodiments, a non-transitory processor-readable medium of the smart device stores multiple display color value settings profiles, but only the display color value settings profile that corresponds to the smart device's colored film is activated.

At block 2260, ambient light may be sensed by an ambient light sensor of the smart device through the cover. A brightness of the electronic display, visible by users through the cover, may be controlled based on the ambient light measurement sensed by the ambient light sensor and the active ambient light tint correction profile that corresponds to the tinting of the cover. Further, color output by the electronic display device may be adjusted based on the activated display color settings profile that is active on the smart device.

Figure 5:
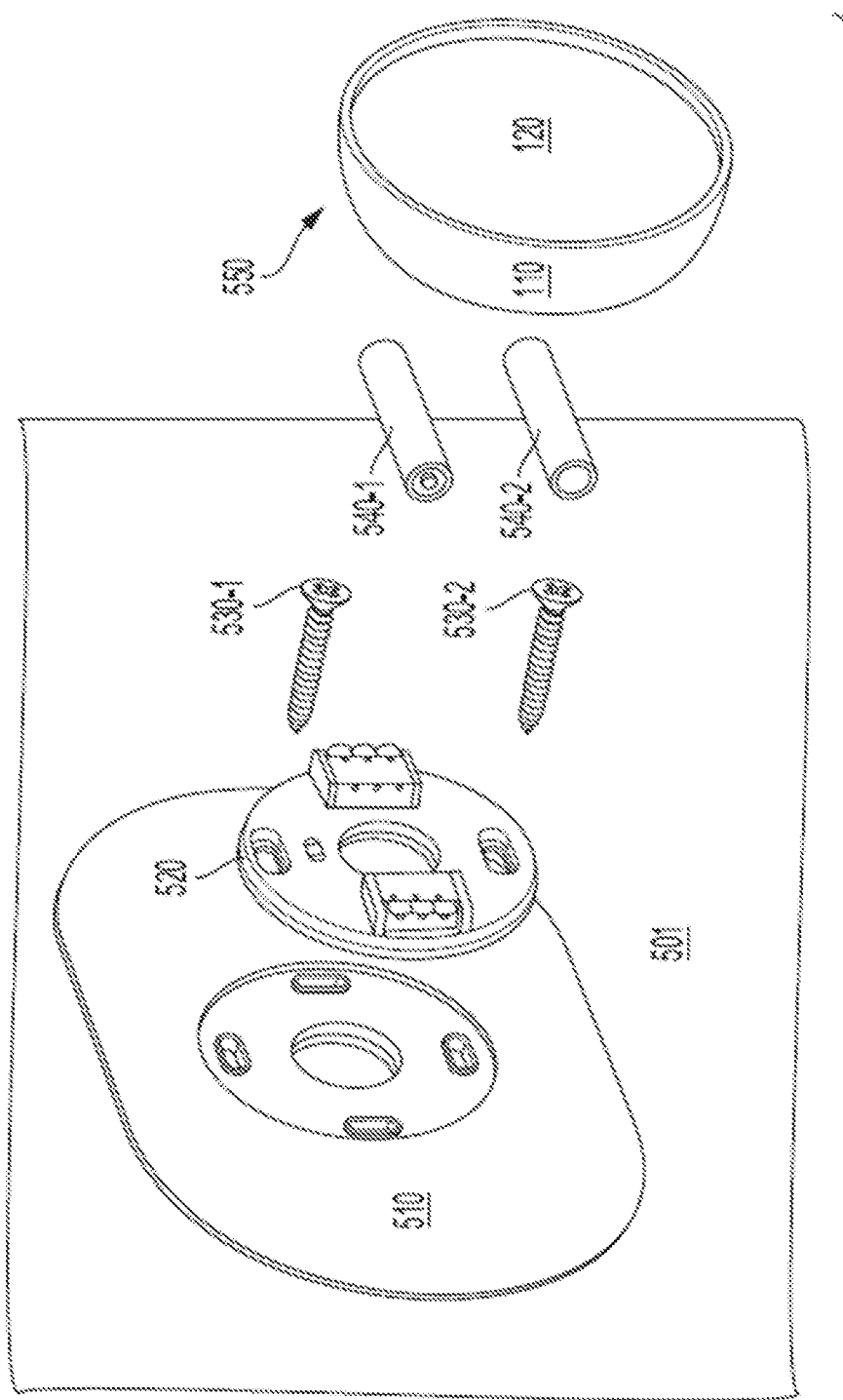
FIG. 5 illustrates an embodiment of a thermostat mounting system.

FIG. 5 illustrates an embodiment of thermostat mounting system 500. Thermostat mounting system 500 can include: trim plate 510; backplate 520; fasteners 530; batteries 540; and thermostat 550. Thermostat 550 can represent an embodiment of thermostat 100 of FIG. 1 and the other thermostat embodiments detailed herein. Trim plate 510 may be plastic, wooden, or metallic plate that defines several holes to accommodate fasteners 530 and allow HVAC (heating, ventilation, and air conditioning) control wires to pass through. Trim plate 510 may serve to conceal any unsightly holes present in wall 501, such as where previous drilling occurred, electrical boxes, paint mismatches, or other aesthetic variances.

Backplate 520 may include multiple receptacles, with each receptacle designated to receive a particular HVAC control wire. Backplate 520 can define one or more holes configured to receive fasteners 530. Fasteners 530 can secure backplate 520 and, if being used, trim plate 510, to a surface, such as a wall.

In some embodiments, two fasteners, fastener 530-1 and fastener 530-2 may be presented. Fasteners 530 may be screws, nails, or some other form of fastener. Fasteners 530 can securely hold backplate 520 and, possibly, trim plate 510 to a surface, such as a wall. Thermostat 550 may removably attach with backplate 520. A user may be able to attach thermostat 550 to backplate 520 by pushing thermostat 550 against backplate 520. Similarly, a user can remove thermostat 550 from backplate 520 by pulling thermostat 550 away from backplate 520. When thermostat 550 is connected with backplate 520, electrical connections between thermostat 550 and HVAC control wires that have been connected with the receptacles of backplate 520.

In some embodiments, HVAC control wires can include a "C" wire, which stands for common wire. The C wire delivers power, such as in the form of 24 V AC, to thermostat 550. Thermostat 550, being connected with a C wire (and, possibly an "R" wire, which is typically red), can have access to a power supply that does not need to be periodically replaced or recharged, such as batteries 540. In some embodiments, if a C wire is not present, thermostat 550 can function using batteries 540 as its exclusive power source.

Batteries 540, which can include one or more batteries, such as battery 540-1 and battery 540-2, can serve as a primary power source or as a backup power source. In some embodiments, one or more features of thermostat 550 can be disabled if only batteries 540 are available as a power supply. Batteries 540 may be replaceable by a user. Batteries 540 may be rechargeable.

Figure 6:
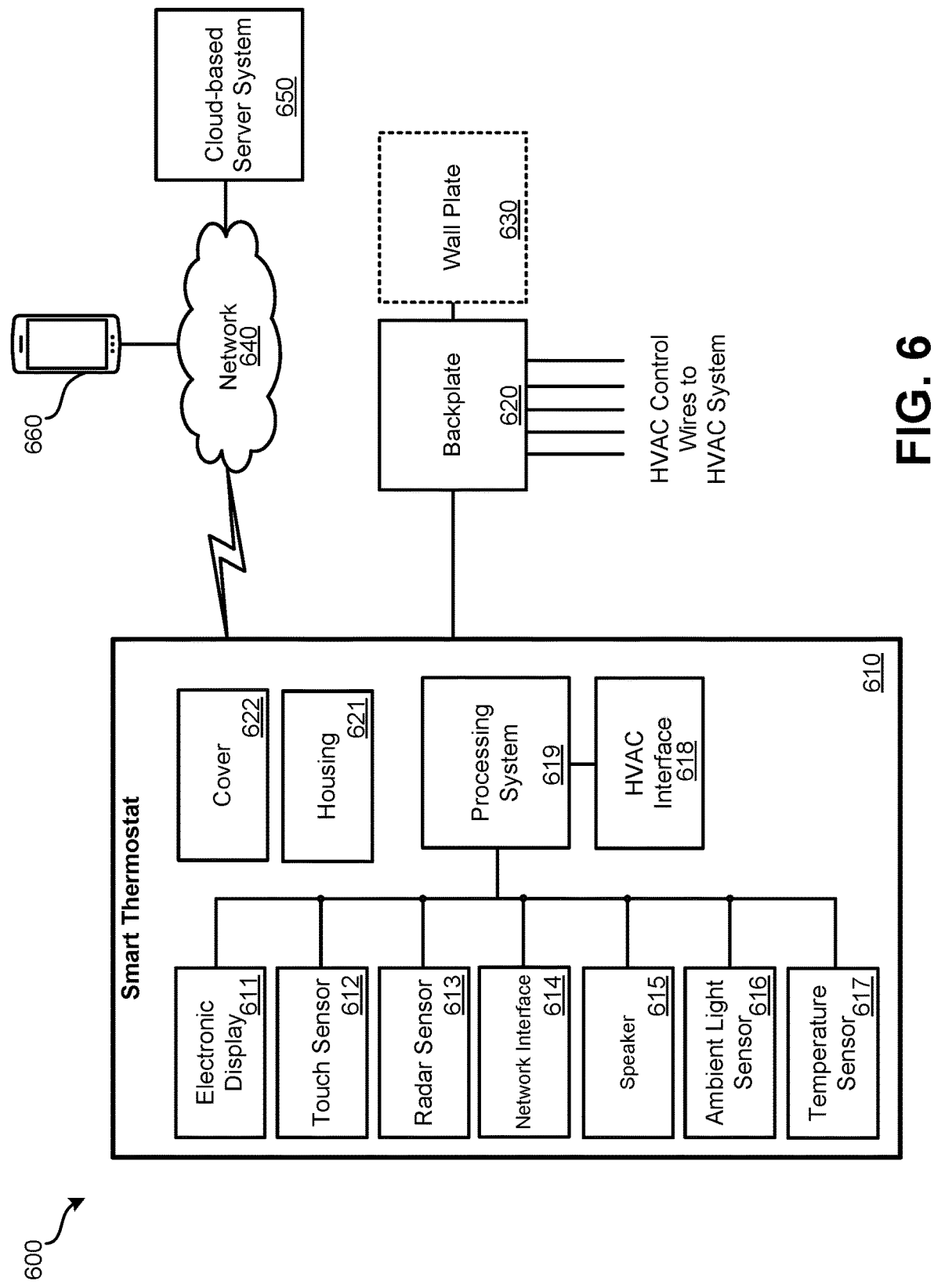
FIG. 6 illustrates an embodiment of a smart thermostat system.

FIG. 6 illustrates an embodiment of a smart thermostat system 600. Smart thermostat system 600 can include smart thermostat 610; backplate 620; trim plate 630; network 640; cloud-based server system 650; and computerized device 660. Smart thermostat 610 can represent any of the thermostats detailed in relation to FIGS. 1-5. Thermostat 610 can include: electronic display 611; touch sensor 612; radar sensor 613; network interface 614; speaker 615; ambient light sensor 616; temperature sensor 617; HVAC interface 618; processing system 619; housing 621; and cover 622.

Electronic display 611 may be visible through cover 622. In some embodiments, electronic display 611 is only visible when electronic display 611 is illuminated. In some embodiments, electronic display 611 is not a touch screen. Touch sensor 612 may allow one or more gestures, including tap and swipe gestures, to be detected. Touch sensor 612 may be a capacitive sensor that includes multiple electrodes. In some embodiments, touch sensor 612 is a touch strip that includes five or more electrodes.

Radar sensor 613 may be configured to output radio waves into the ambient environment in front of electronic display 611 of thermostat 610. Radar sensor 613 may be an integrated circuit that includes one or more antennas, one or more RF emitters, and one or more RF receivers. Radar sensor 613 may be able to detect the presence of a user and the distance at which the user is located. Radar sensor 613 may use frequency-modulated continuous wave (FMCW) radar. Radar sensor 613 may emit radio waves and receive reflected radio waves through cover 622. Radar sensor 613 may emit chirps of radar that sweep from a first frequency to a second frequency. Therefore, the waveform output by radar sensor 613 may be a saw tooth waveform. Using receive-side beam steering on the reflected radio waves received using multiple antennas, certain regions may be targeted for sensing the presence of users. For instance, beam steering away from the ground may be performed to avoid pets being potentially incorrectly detected as a user.

Network interface 614 may be used to communicate with one or more wired or wireless networks. Network interface 614 may communicate with a wireless local area network, such as a WiFi network. Additional or alternative network interfaces may also be present. For example, thermostat 610 may be able to communicate with a user device directly, such as using Bluetooth.

Thermostat 610 may be able to communicate via a mesh network with various other home automation devices. Mesh networks may use relatively less power compared to wireless local area network-based communication, such as WiFi. In some embodiments, thermostat 610 can serve as an edge router that translates communications between a mesh network and a wireless network, such as a WiFi network. In some embodiments, a wired network interface may be present, such as to allow communication with a local area network (LAN). One or more direct wireless communication interfaces may also be present, such as to enable direct communication with a remote temperature sensor installed in a different housing external and distinct from housing 621. The evolution of wireless communication to fifth generation (5G) and sixth generation (6G) standards and technologies provides greater throughput with lower latency which enhances mobile broadband services. 5G and 6G technologies also provide new classes of services, over control and data channels, for vehicular networking (V2X), fixed wireless broadband, and the Internet of Things (IoT). Thermostat 610 may include one or more wireless interfaces that can communicate using 5G and/or 6G networks.

Speaker 615 can be used to output audio. Speaker 615 may be used to output beeps, clicks, or other audible sounds, such as in response to the detection of user input via touch sensor 612.

Ambient light sensor 616 may sense the amount of light present in the environment of thermostat 610. Measurements made by ambient light sensor 616 may be used to adjust the brightness of electronic display 611. In some embodiments, ambient light sensor 616 senses an amount of ambient light through cover 622. Therefore, compensation for the reflectivity of cover 622 may be made such that the ambient light levels are correctly determined via ambient light sensor 616. A light pipe may be present between ambient light sensor 616 and cover 622 such that in a particular region of cover 622, light that is transmitted through cover 622, is directed to ambient light sensor 616, which may be mounted to a printed circuit board (PCB), such as a PCB to which processing system 619 is attached.

One or more temperature sensors, such as temperature sensor 617, may be present within thermostat 610. Temperature sensor 617 may be used to measure the ambient temperature in the environment of thermostat 610. One or more additional temperature sensors that are remote from thermostat 610 may additionally or alternatively be used to measure the temperature of the ambient environment.

Cover 622 may have a transmissivity sufficient to allow illuminated portions of electronic display 611 to be viewed through cover 622 from an exterior of thermostat 610 by a user. Cover 622 may have a reflectivity sufficient such that portions of cover 622 that are not illuminated from behind appear to have a mirrored effect to a user viewing a front of thermostat 610.

HVAC interface 618 can include one or more interfaces that control whether a circuit involving various HVAC control wires that are connected either directly with thermostat 610 or with backplate 620 is completed. A heating system (e.g., furnace, heat pump), cooling system (e.g., air conditioner), and/or fan may be controlled via HVAC wires by opening and closing circuits that include the HVAC control wires.

Processing system 619 can include one or more processors. Processing system 619 may include one or more special-purpose or general-purpose processors. Such special-purpose processors may include processors that are specifically designed to perform the functions detailed herein. Such special-purpose processors may be ASICs or FPGAs which are general-purpose components that are physically and electrically configured to perform the functions detailed herein. Such general-purpose processors may execute special-purpose software that is stored using one or more non-transitory processor-readable mediums, such as random access memory (RAM), flash memory, a hard disk drive (HDD), or a solid state drive (SSD) of thermostat 610.

Processing system 619 may output information for presentation to electronic display 611. Processing system 619 can receive information from touch sensor 612, radar sensor 613, and ambient light sensor 616. Processing system 619 can perform bidirectional communication with network interface 614. Processing system 619 can output information to be output as sound to speaker 615. Processing system 619 can control the HVAC system via HVAC interface 618.

Housing 621 may house all of the components of thermostat 610. Touch sensor 612 may be interacted with a user through housing 621. Housing 621 may define a sidewall and an aperture, such as a rounded aperture (e.g., a circular aperture) in which cover 622 is present.

Thermostat 610 may be attached (and removed) from backplate 620. HVAC control wires may be attached with terminals or receptacles of backplate 620. Alternatively, such control wires may be directly connected with thermostat 610. In some embodiments, trim plate 630 may additionally be installed between backplate 620 and a surface, such as a wall, such as for aesthetic reasons (e.g., cover an unsightly hole through which HVAC wires protrude from the wall).

Network 640 can include one or more wireless networks, wired networks, public networks, private networks, and/or mesh networks. A home wireless local area network (e.g., a Wi-Fi network) may be part of network 640. Network 640 can include the Internet. Network 640 can include a mesh network, which may include one or more other smart home devices, may be used to enable thermostat 610 to communicate with another network, such as a Wi-Fi network. Thermostat 610 may function as an edge router that translates communications from a relatively low power mesh network received from other devices to another form of network, such as a relatively higher power network, such as a Wi-Fi network.

Cloud-based server system 650 can maintain an account mapped to smart thermostat 610. Thermostat 610 may periodically or intermittently communicate with cloud-based server system 650 to determine whether setpoint or schedule changes have been made. A user may interact with thermostat 610 via computerized device 660, which may be a mobile device, smartphone, tablet computer, laptop computer, desktop computer, or some other form of computerized device that can communicate with cloud-based server system 650 via network 640 or can communicate directly with thermostat 610 (e.g., via Bluetooth or some other device-to-device communication protocol). A user can interact with an application executed on computerized device 660 to control or interact with thermostat 610.

Figure 7:
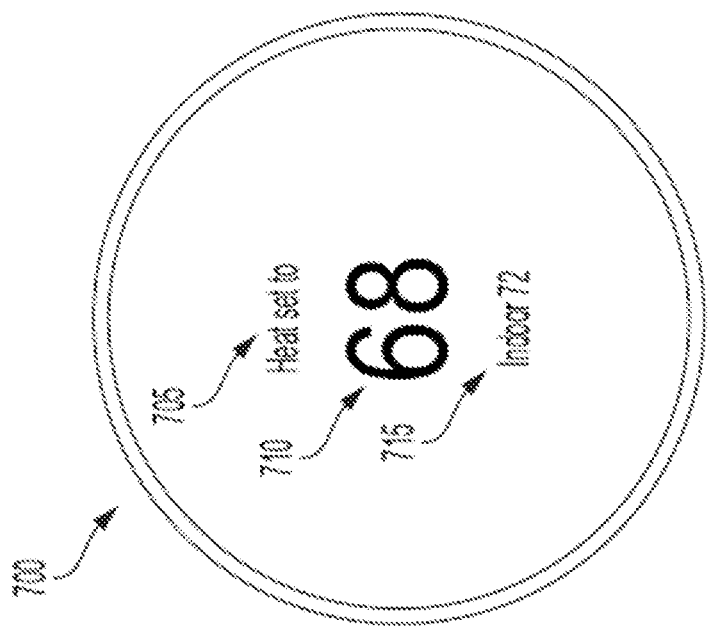
FIG. 7 illustrates an embodiment of a default user interface that may be presented by thermostat.

FIGS. 7 through 13 illustrate various user interfaces that may be used by embodiments of smart thermostats, as detailed herein. FIG. 7 illustrates an embodiment of a default user interface that may be presented by thermostat 700. Thermostat 700 can represent thermostat 100 or any of the other embodiments of a thermostat detailed in relation to FIGS. 1-6. Thermostat 700 may present such an interface when a user is detected in a vicinity of thermostat 700, such as via radar sensor 613. Besides being detected, a user might not have provided any input to cause the interface to be presented. Additionally or alternatively, the interface may be presented when a user has exited from a main menu, such as detailed in relation to FIG. 10, or selected a particular icon or option from the main menu. Setpoint temperature 710 may be presented in the middle of the electronic display and may indicate the temperature to which the environment is being warmed. Setpoint temperature 710 may be presented in a larger size than other information presented on the display screen of thermostat 700.

Message 705 may indicate that heating is enabled and make clear to a user that setpoint temperature 710 is indicative of a temperature to which the environment of thermostat 700 is being heated. If instead of heating, cooling was enabled, message 705 may indicate something similar to "Cooling set to" to indicate that cooling is activated. Message 715 may indicate what the current measured temperature the thermostat's environment is, such as measured by temperature sensor 617.

In some embodiments, message 705 switches between presenting two or more pieces of information. A ranked listing of types of information may be stored. Some number of the highest ranking pieces of information that are available for output may be presented as message 705 and periodically switched between. For instance, a low battery message may also be presented as message 705. In this example, periodically, such as every two seconds, message 705 may rotate between reading "Heat set to" and "Low Battery," or any other two messages that are selected for presentation based on having the highest rank.

A user swiping up or swiping down on the touch sensor of thermostat 700 can cause setpoint temperature 710 to be adjusted up or down, respectively. The shorter the swipe, the smaller the adjustment in temperature. A fast swipe may cause the temperature to rapidly be adjusted, while a slow swipe may cause the temperature to slowly change. A fast swipe may cause the temperature to change in greater increments than a slow swipe. For example, a fast swipe may cause the temperature to adjust by 2 or 3 degrees (or some other, higher value) at a time; a slow swipe may cause the temperature to adjust by 0.5 or 1 degree (or some other, smaller value) at a time.

Figure 8:
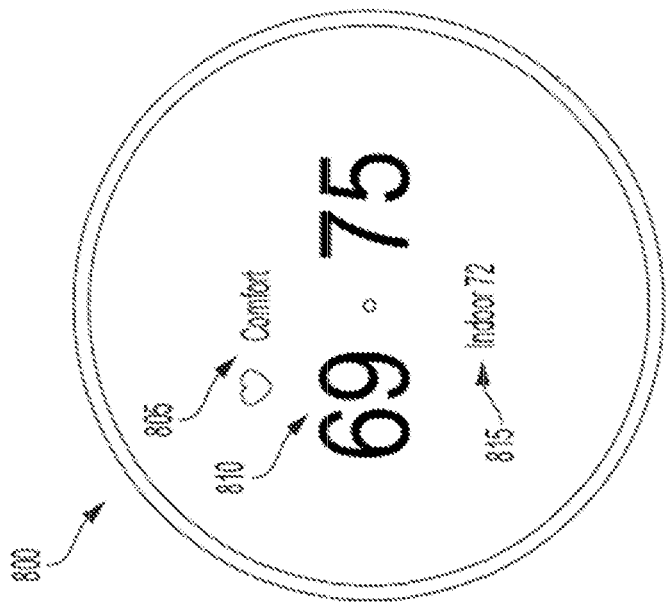
FIG. 8 illustrates an embodiment of a default user interface that may be presented by thermostat.

FIG. 8 illustrates an embodiment of a default user interface that may be presented by thermostat 800 when a dual heating-cooling mode is enabled. Thermostat 800 can represent thermostat 100 or any of the other embodiments of a thermostat detailed in relation to FIGS. 1-7. For thermostat 800, a joint heating and cooling mode is enabled in which a temperature setpoint range 810 is defined for heating and cooling. Cooling is used to keep the temperature at or below the higher setpoint temperature and heating is used to keep the temperature at or above the lower setpoint temperature. Temperature 815 indicates the current temperature measured by thermostat 800.

For thermostat 800, message 805 displays "Comfort" with a graphical heart. A user may define multiple preset setpoint temperatures or setpoint temperature ranges. In the example of thermostat 800, a user has defined a preset temperature range named "comfort" as corresponding to the temperature range of 69° F.-75° F. Other predefined setpoint temperatures or setpoint temperature ranges may be possible, such as "Eco" and "sleep" modes. Such predefined setpoint temperatures or setpoint temperature ranges may be helpful to a user when creating a schedule: for a given time period, a user can select one of the predefined and named temperature setpoints or setpoint ranges rather than directly entering a specific numerical setpoint temperature value. For each predefined temperature setpoint or setpoint range, a graphical symbol may be displayed that represents the predefined setpoint temperature or setpoint temperature range. For example, a heart may be displayed for "comfort," a leaf may be displayed for "eco," and a bed may be displayed for "sleep."

Figure 9:
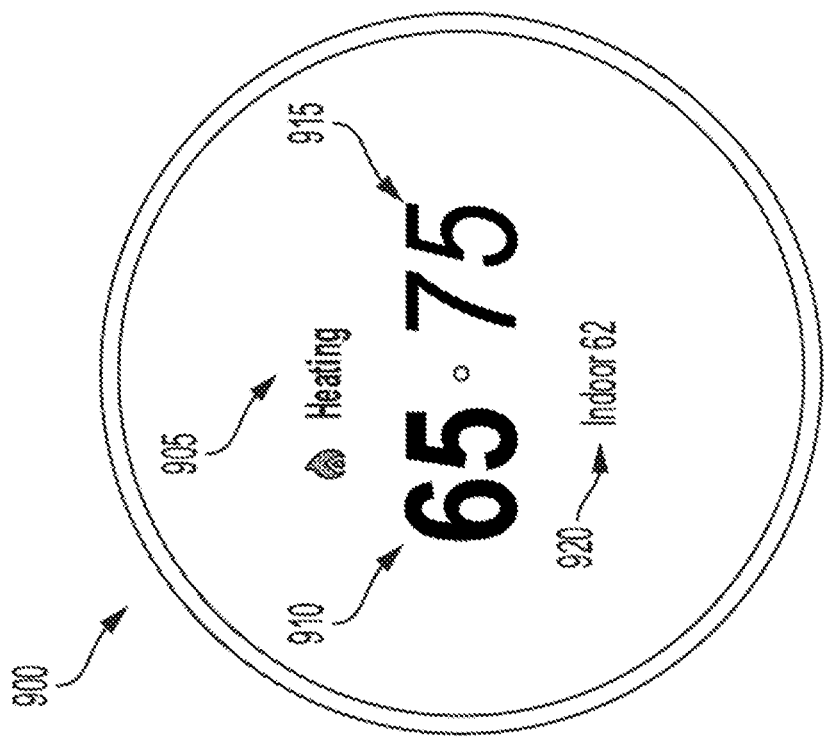
FIG. 9 illustrates an embodiment of a thermostat presenting a default user interface that may be presented when heating is active while a dual heating-cooling mode is enabled.

For thermostat 700 and thermostat 800, the setpoint temperatures and words may be presented in a color, such as white, that is indicative of neither heating or cooling of the HVAC system being activated. In FIG. 9, thermostat 900 illustrates an embodiment of a default user interface that may be presented by thermostat 900 when heating is active while a dual heating-cooling mode is enabled. Thermostat 900 can represent thermostat 100 or any of the other embodiments of a thermostat detailed in relation to FIGS. 1-8. To indicate that heating is active, lower setpoint 910, which is the controlling temperature for heating, may be emphasized using color and/or brightness. For example, temperature setpoint 910 can be displayed in red, red/orange, or orange to indicate heating is active. Higher setpoint 915 used for cooling (75° F. in this example) may be indicated in white or blue. Additionally, setpoint 915 may be deemphasized by the value not being displayed as bright as setpoint 910. If cooling was active instead of heating, the reverse situation would be true: setpoint temperature 915 would be emphasized (e.g., brighter), while the setpoint 910 would be deemphasized. Other forms of emphasis are possible, such as the size of the setpoint, bolding the setpoint, flashing the setpoint, etc.

Message 905 may indicate whether heating or cooling is active. If heating is active, message 905 may be displayed in a same color as setpoint 910. If cooling is active, message 905 may be displayed in a same color as setpoint 915. An icon or other form of graphic may be presented as part of message 905 that is indicative of active heating or cooling. For example, a flame may be indicative of heating and a snowflake may be indicative of cooling. The icon or graphic may use the same color as the remainder of message 905.

Message 920 may present the current measured ambient temperature, possibly along with a location at which the temperature was measured. For instance, "indoor" may indicate that the temperature was measured using temperature sensor 617. An outdoor temperature may occasionally be presented that is indicative of a temperature retrieved from a remote server for the general location of the thermostat.

Figure 10:
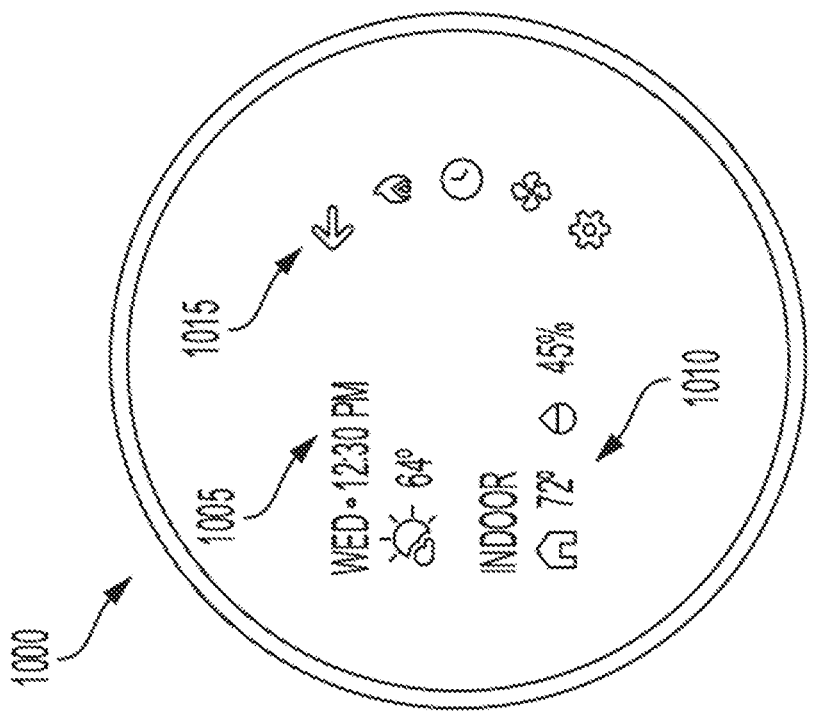
FIG. 10 illustrates an embodiment of a thermostat presenting a main menu.

FIG. 10 illustrates an embodiment of a thermostat 1000 presenting a main menu. The main menu may be presented in response to a user tapping or touching and holding a touch sensor, such as a touch strip, of thermostat 1000. Thermostat 1000 can represent thermostat 100 or any of the other embodiments of a thermostat detailed in relation to FIGS. 1-9. To navigate the main menu, a user can interact with the touch strip. The user may swipe down to move selection to lower icons of selectable icons 1015. The user may swipe up to move selection to higher icons of selectable icons 1015. The currently selected icon may be emphasized, such as by being brighter and/or larger than other icons. In some embodiments, color is used to emphasize the selected icon. In order to return back to the default interface, a user may highlight and select a back icon, which in some embodiments is represented by an arrow pointed left. Selection of an icon may be accomplished by a user tapping the touch sensor while the icon is emphasized.

The main menu may also include additional information, such as information 1005. Information 1005 may include weather information, outdoor temperature information, the day, and/or the time. Such information may be retrieved from a remote server or may be tracked by the thermostat. Information 1010 may indicate the indoor temperature and indoor humidity. Icons or graphics may be used to indicate at least some of information 1005 and information 1010 graphically. For example, weather information may be indicated using graphics such as the sun, clouds, rain, snow, wind, etc. A graphic indicating a temperature that corresponds to the indoor temperature may include a graphic of a house. A graphic indicating the relative humidity may be a raindrop.

Figure 11:
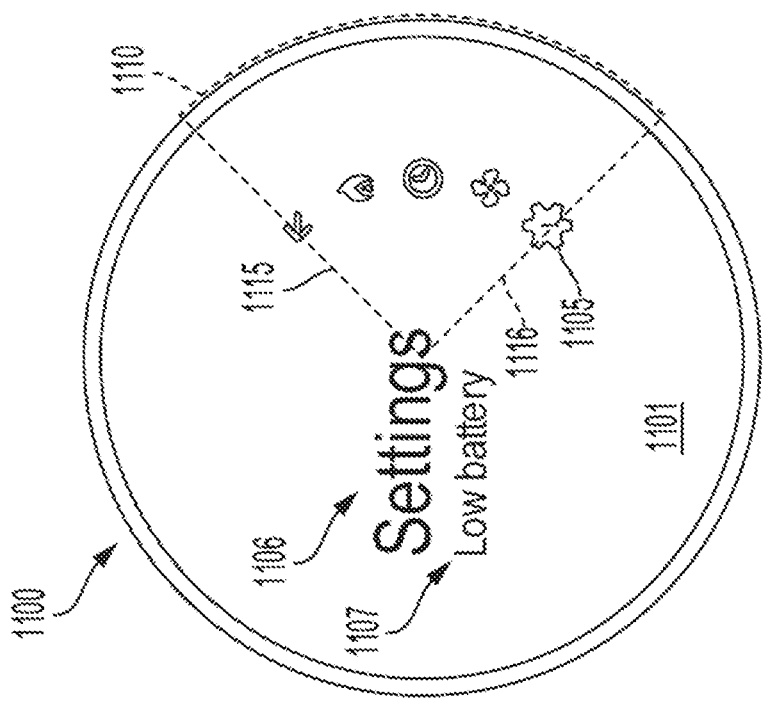
FIG. 11 illustrates an embodiment of a thermostat presenting a main menu on which a warning is present.

FIG. 11 illustrates an embodiment of a thermostat 1100 presenting a main menu on which a warning is present. Thermostat 1100 can represent thermostat 100 or any of the other embodiments of a thermostat detailed in relation to FIGS. 1-10. An icon, such as a gear, may be used to indicate thermostat settings. If there is a problem that needs to be addressed by a user, the setting icon may be changed to alert the user to the problem. For instance, an exclamation point, which may be colored, may be presented on the settings icon, such as on icon 1105. Additionally or alternatively, text may be presented that indicates the nature of the problem. For instance, "low battery" may be presented as message 1107 to indicate the nature of the problem that needs to be addressed by the user. If no problem is present, message 1107 might not be displayed. Message 1106 may indicate text that corresponds to the current icon selection. Since icon 1105 is selected, message 1106 indicates "settings."

Angle 1115 and angle 1116, originating from a center of cover 1101 of thermostat 1100, indicates the relationship that can exist between icons or graphics of a menu, such as a main menu, and the location and length of a touch sensor, such as a touch strip. Arc 1110 represents the location and angle of a touch strip that is interacted with by a user via a sidewall of thermostat 1100, such as indicated by touch strip indicator 310 of FIG. 3B. To allow for more intuitive input from a user, the arrangement of multiple icons or graphics may approximately or exactly match the shape and position of the touch strip. On the user interface of thermostat 1100, icons are presented in an arc from angle 1115 to angle 1116. Angle 1115 and angle 1116 also correspond to the ends of the touch strip corresponding to arc 1110. In some embodiments, the entirety of the region on the sidewall of the housing on which a user can provide touch input is within the arc defined by angle 1115 and angle 1116. In some embodiments, the region on the sidewall of the housing on which a user can provide touch input approximately (e.g., within +/−10°, within +/−5°) corresponds to arc 1110 defined by angle 1115 and angle 1116.

In some embodiments, a downward swipe gesture along an entirety of arc 1110 on the touch sensor may be sufficient to move selection from a top icon of the menu to a bottom icon of the menu. Similarly, an upward swipe gesture along an entirety of arc 1110 on the touch sensor may be sufficient to move selection from a bottom icon of the menu to a top icon of the menu. As such, to navigate the menu, a user might not need to perform more than one swipe gesture. A tap gesture can be performed to select an icon and present the icon's associated submenu. In some embodiments, a touch and hold gesture (where the hold is performed for at least a threshold amount of time) may perform an alternative function, such as returning to the previous menu or default interface or jumping to a user-selected favorite interface.

Figure 12:
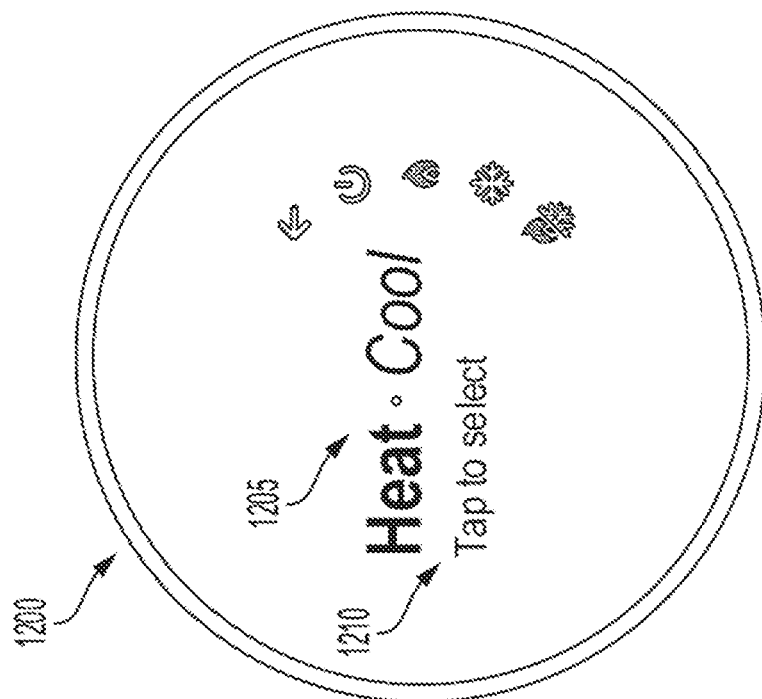
FIG. 12 illustrates an embodiment of a thermostat presenting a heating/cooling menu.

FIG. 12 illustrates an embodiment of a thermostat 1200 presenting a heating/cooling menu. Thermostat 1200 can represent thermostat 100 or any of the other embodiments of a thermostat detailed in relation to FIGS. 1-11. Thermostat 1200 is presenting a heating/cooling menu. In the heating/cooling menu, a user can select whether a heating mode should be enabled, a cooling mode should be enabled, or a combined heating and cooling mode should be enabled. In the heating mode, only the heating source controlled by thermostat 1200 may be eligible for activation. In the cooling mode, only the cooling source controlled by thermostat 1200 may be eligible for activation by thermostat 1200. In the heating/cooling mode, which is indicated by a split flame/snowflake icon, thermostat 1200 may be authorized to activate either heating or cooling based on a range of defined temperature setpoints (e.g., a low temperature setpoint for heating and a high temperature setpoint for cooling) such as detailed in relation to FIGS. 8 and 9. Since heating/cooling mode is currently emphasized, message 1205 indicates text corresponding to heating/cooling mode. Message 1210 may serve as a reminder for the user how to select the currently emphasized icon.

Figure 13:
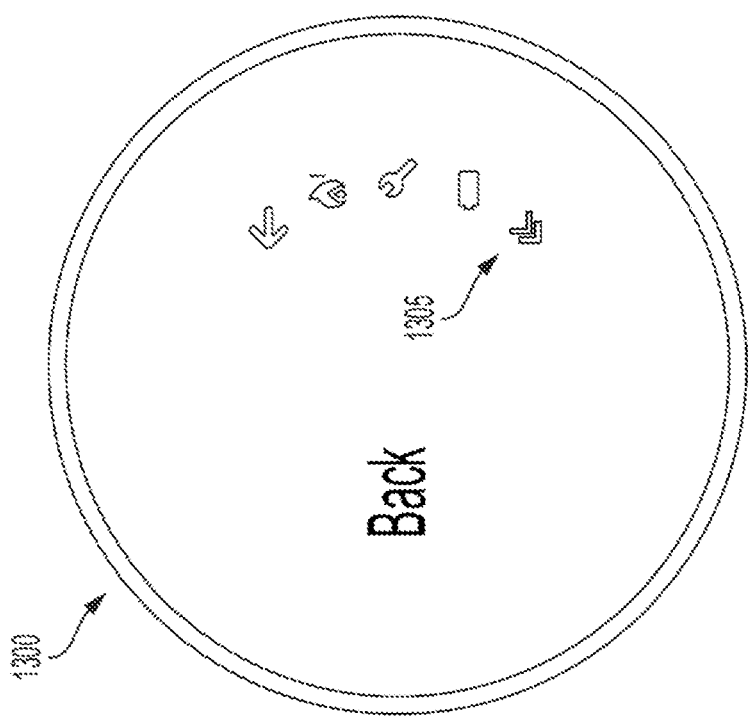
FIG. 13 illustrates an embodiment of thermostat in which a more items available icon is present on a menu.

In some embodiments, no more than a predefined number of selectable icons may be presented at a time, such as to allow the icons to match or remain within angles 1115 and angle 1116. FIG. 13 illustrates an embodiment of thermostat 1300 in which a "more items available" icon is present on a menu. Thermostat 1300 can represent thermostat 100 or any of the other embodiments of a thermostat detailed in relation to FIGS. 1-12. In some embodiments, no more than five icons may be presented at a time, such as to allow all presented icons to be approximately within angle 1115 and angle 1116.

Icon 1305 may be presented as part of a menu but might not be selectable. The presence of icon 1305 may signal to a user that additional icons are available for presentation and selection if the user scrolls down, such as by swiping down. When swiping down toward icon 1305, an icon at the top of the menu may be hidden and an additional, selectable icon may be presented at the bottom of the menu. Icon 1305 may be presented at the top of the menu if additional icons will be presented if a user scrolls upward. Icon 1305 may disappear at the bottom of the menu when no additional icons are available to be presented at the bottom of the menu. Similarly, icon 1305 may only be presented as a top icon when additional icons are available to be presented at the top of the menu. Icon 1305 may be presented at both the top and bottom at a same time if additional icons are available in both directions.

Figure 14:
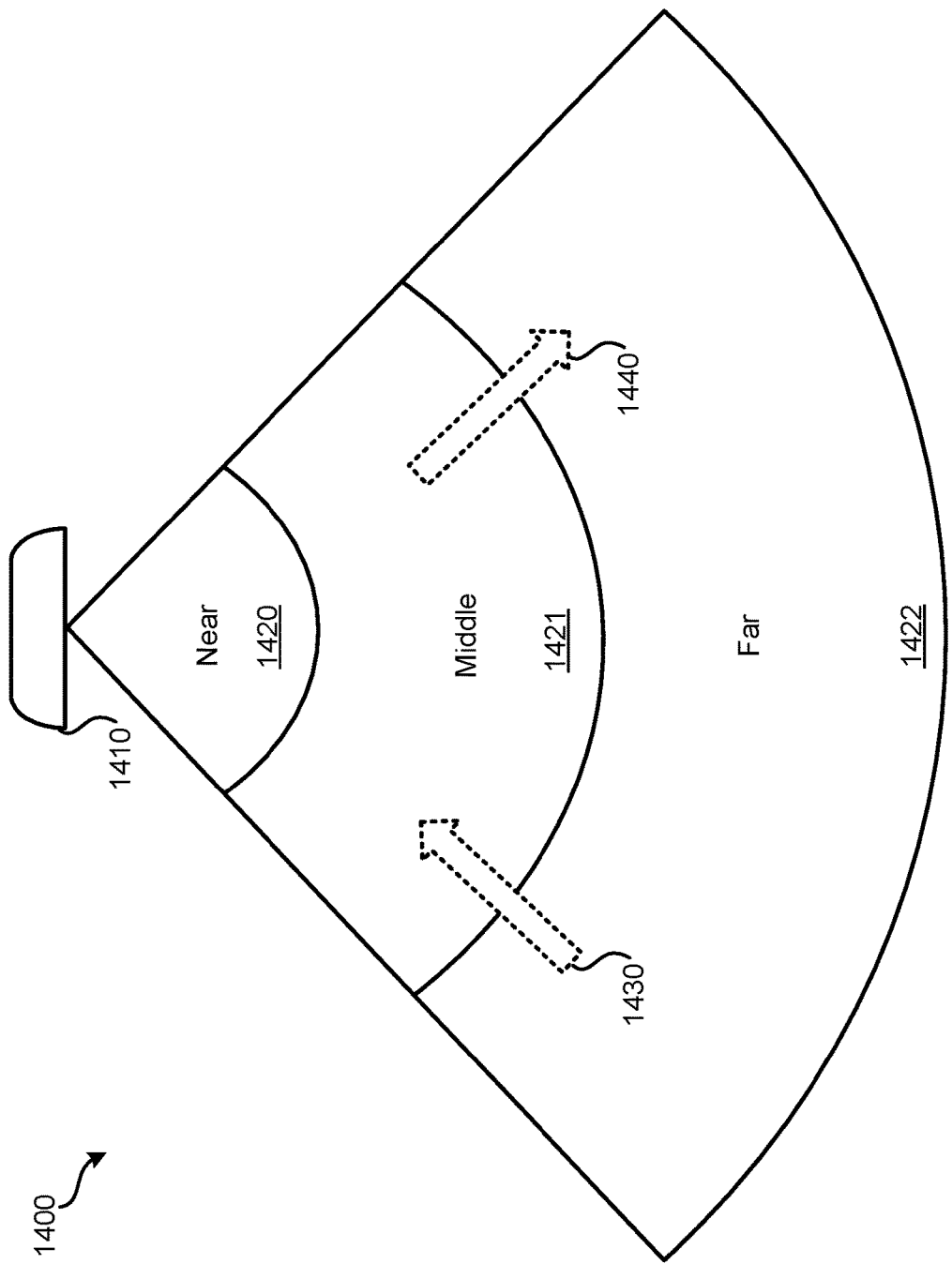
FIG. 14 illustrates a top view of an embodiment of a thermostat using radar to sense for a user in an ambient environment of the thermostat.

As previously detailed, a radar sensor may be incorporated as part of the various detailed embodiments of thermostats. FIG. 14 illustrates a top view of an embodiment of a thermostat using radar to sense for a user in an ambient environment of the thermostat. Thermostat 1400 can represent thermostat 100 or any of the other embodiments of a thermostat detailed in relation to FIGS. 1-13. Thermostat 1400 can have a radar sensor, such as radar sensor 613, that emits radio waves, such as having a frequency between 58-62 GHz, into the ambient environment of thermostat 1410. The emitted radar may be FMCW radar, such as in a saw tooth pattern. Reflected radio waves that are received by the radar sensor may be reflected by stationary and moving objects. By using FMCW, a distance to an object may be determined. Therefore, in contrast to passive infrared sensing, it may be possible to determine a distance to a user.

In some embodiments, based on a distance at which a user is detected, different information may be presented by the electronic display of thermostat 1410. For example, outside of far distance range 1422, the electronic display of thermostat 1410 may be turned off. Within far distance range 1422, a basic setpoint temperature display may be presented, such as just the temperature as indicated in FIG. 2. Within middle distance range 1421, a greater amount of detail may be presented on the display, such as default interfaces, such as those of FIG. 7, 8, or 9. Within a near distance range 1420, a still greater (or different) amount of information may be presented. For instance, the presented interfaces may be augmented with weather, time, and/or humidity data. In other embodiments, as the distance to a user changes as measured by thermostat 1410, greater or fewer numbers of different interfaces may be presented.

In some embodiments, whether the display of thermostat 1410 is activated may be based on whether the user is detected as moving toward or away from thermostat 1410. Using radar, a direction of movement of the user, such as indicated by arrow 1430 or arrow 1440 may be determined. If the user is moving away from thermostat 1410, the display of thermostat 1410 may be disabled or the brightness decreased. If the user is moving toward thermostat 1410, the display of thermostat 1410 may be enabled or the brightness increased.

In order to detect whether a user is moving toward or away from thermostat 1410, data across multiple radar chirps may be analyzed. For a given emitted chirp, a reflected radar chirp may be received by the radar sensor, possibly through cover 622. The reflected radar chirp may be mixed with a portion of the radar chirp about to be emitted to get baseband raw waveform data. The frequency of the baseband raw waveform data, which is indicative of the difference between the currently-being emitted radar and the received radar, is indicative of the distance to the object that reflected the radar. Filtering may be performed to remove reflections due to static objects. Therefore, a filtered set of waveform data may be indicative of radar reflected by moving objects.

A Fast Fourier transform (FFT) may be performed across the filtered waveform data from multiple chirps. This performed FFT may be indicative of a velocity at which a moving object is moving toward or away from the radar sensor. Therefore, for example, a positive velocity may be indicative of a user moving toward the thermostat while a negative velocity may be indicative of a user moving away from the thermostat. Based upon the speed at which a user is moving toward the thermostat, the information or interface presented may be selected. For instance, if the user is moving relatively quickly toward the thermostat, a different interface may be presented than if the user is relatively slowly moving toward the thermostat.

Additionally or alternatively, a FFT may be performed on the filtered waveform data for a single chirp. As previously noted, reflected received radio waves are mixed with radio waves being transmitted. Due to propagation delay of electromagnetic radiation, the frequency obtained by mixing will vary based on the distance to the object that reflected the radio waves. After filtering out reflections due to static objects, a FFT may be performed on the filtered waveform data. The predominant frequency identified by the FFT can be indicative of the distance at which the user is located. In addition or in alternate to the direction and/or speed at which a user is moving, the distance at which the user is located may be used to determine whether and which interface should be presented by thermostat 1410.

Figure 15:
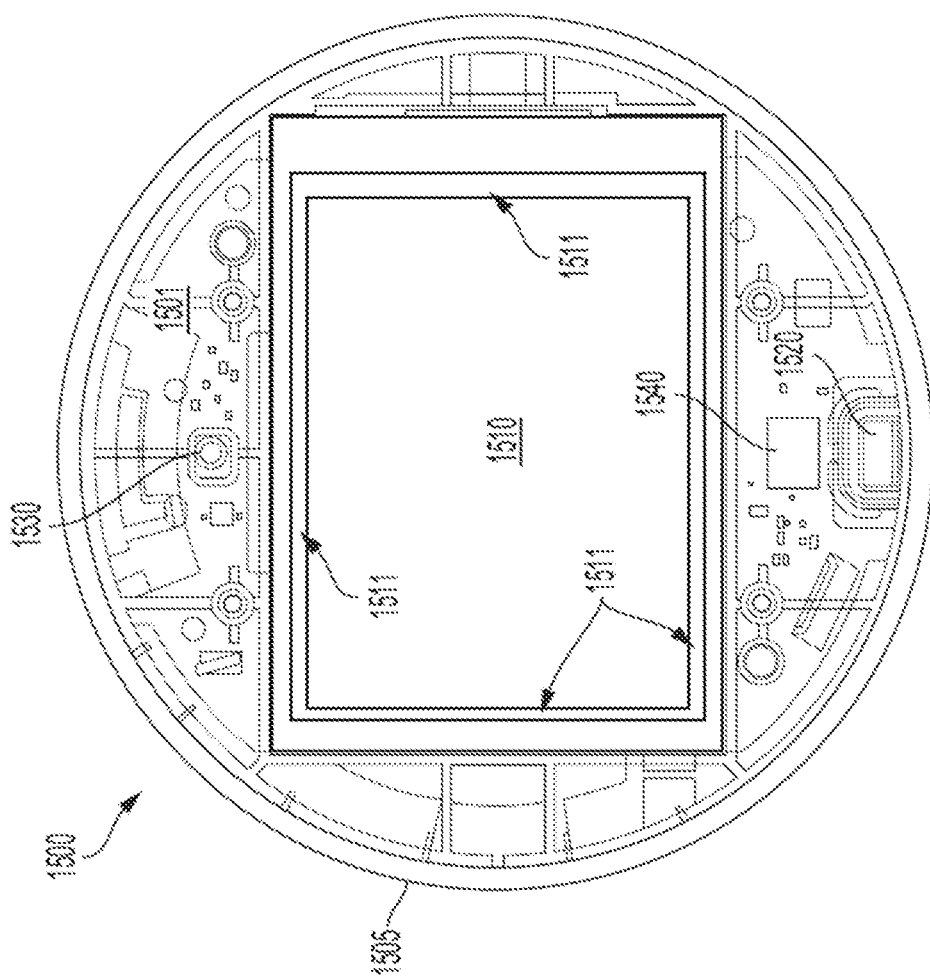
FIG. 15 illustrates an embodiment of a thermostat with its cover removed.

FIG. 15 illustrates an embodiment of thermostat 1500 with its cover removed as viewed from a front of thermostat 1500. Thermostat 1500 can represent thermostat 100 or any of the other embodiments of a thermostat detailed in relation to FIGS. 1-14. With the cover removed, printed circuit board (PCB) 1501 may be visible. PCB 1501 may be housed by housing 1505 (which corresponds to housing 621). PCB 1501 may be rounded, such as circular in shape. Attached with PCB 1501 may be electronic display 1510, temperature sensor 1520, ambient light sensor 1530, and radar sensor 1540. Electronic display 1510 may be generally rectangular in shape. While display 1510 does not span the entire surface of PCB 1501, when the cover is present, it might not be possible for a user to see edge 1511 of display 1510. Therefore, while display 1510 may be rectangular in shape, this shape might not be discernable through the cover, when present.

Ambient light sensor 1530 may be attached with PCB 1501. A light pipe, such as made from translucent or transparent plastic, may be present that directs light that passes through a portion of the cover to ambient light sensor 1530. The light pipe may contact ambient light sensor 1530 and a back side of the cover, when present. However, no lens, hole, or other incongruity may be present on the cover for the light pipe or ambient light sensor 1530.

Temperature sensor 1520, which corresponds to temperature sensor 617 and is used to measure the ambient temperature of the environment of thermostat 1500, may be isolated from heat sources on PCB 1501. Such isolation may be performed by locating temperature sensor 1520 away from other electronic components (e.g., processors, wireless network interfaces, display 1510) that generate heat. Additionally or alternatively, one or more cutouts on PCB 1501 may be present to decrease heat transfer through the PCB from heat-generating components to temperature sensor 1520.

Radar sensor 1540, which corresponds to radar sensor 613 of FIG. 6, may be located to avoid metallic components of thermostat 1500 and components that could create interference, such as a wireless network interface. Particularly, radar sensor 1540 might be located on PCB 1501 such that it is located behind a cover (when present), but not behind display 1510. Display 1510 may include metallic shielding that could negatively impact the ability of radar sensor 1540 to transmit and receive radio waves into the ambient environment of thermostat 1500. Therefore, radar sensor 1540 may be positioned such that it can transmit radio waves into the ambient environment and receive reflected radio waves through the cover, but not through display 1510. Radar sensor 1540 may be a single integrated chip (IC), such as detailed in relation to FIG. 17.

In some embodiments, a space may be present between radar sensor 1540 and a cover of thermostat 1500, when present. This space may be open, in that it is filled with air, but no components. The distance from the antennas of the radar sensor to the cover may be approximately one-fourth of a wavelength or some other odd multiple of one-fourth of a wavelength. Such a distance may help decrease constructive reflections by the cover that could be received by one or more antennas of radar sensor 1540. If FMCW is used by the radar sensor, a sweep from a first frequency to a second frequency is performed. Therefore, the distance may be selected to minimize constructive reflections across the frequency range of the frequency sweep.

Figure 16:
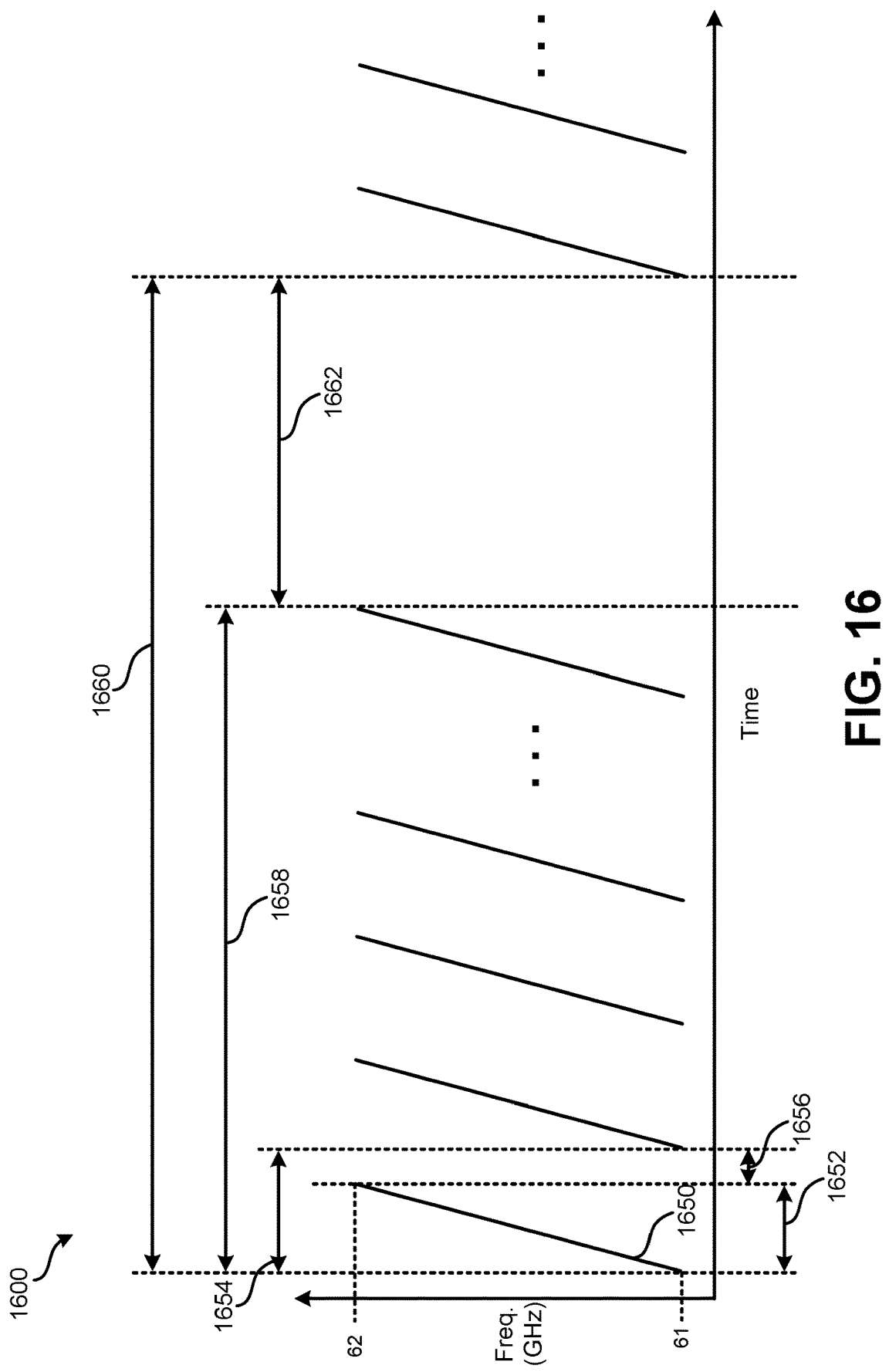
FIG. 16 illustrates a chirp timing diagram for frequency-modulated continuous wave (FMCW) radar radio waves output by a radar sensor.

FIG. 16 illustrates chirp timing diagram 1600 for frequency modulated continuous wave (FMCW) radar radio waves output by a radar subsystem. Chirp timing diagram 1600 is not to scale. Radar sensor 613 may generally output radar in the pattern of chirp timing diagram 1600. Chirp 1650 represents a continuous pulse of radio waves that sweeps up in frequency from a low frequency to a high frequency. In other embodiments, individual chirps may continuously sweep down from a high frequency to a low frequency. In some embodiments, the low frequency is 61 GHz and the high frequency is 61.5 GHz. (For such frequencies, the radio waves may be referred to as millimeter waves.) The low frequency and the high frequency may be varied by embodiment. For instance, the low frequency may be between 40 and 60 GHz, and the high frequency may be between 45 GHz and 80 GHz. In some embodiments, the low frequency is between 57 GHz and 63 GHz and the high frequency is greater than the low frequency and is also between 57 GHz and 63 GHz. In some embodiments, each chirp includes a linear sweep from a low frequency to a high frequency (or the reverse). In other embodiments, an exponential or some other pattern may be used to sweep the frequency from low to high or high to low. The shape of the chirp (as defined by the bandwidth sweep and chirp duration) may be designed to meet a particular distance detection requirement.

Chirp 1650, which can be representative of all chirps in chirp timing diagram 1600, may have chirp duration 1652 of 128 µs. In other embodiments, chirp duration 1652 may be longer or shorter, such as between 30 µs and 600 µs. In some embodiments, a period of time may elapse before a subsequent chirp is emitted. Chirp period may be 500 µs, thus meaning the chirps repeat at 2 kHz. In other embodiments chirp period 1654 may be between 100 µs and 1 ms. This duration varies based on the selected chirp duration 1652 and inter-chirp pause 1656.

A number of chirps that are output, separated by inter-chirp pauses, may be referred to as burst 1658 or frame 1658. Frame 1658 may include sixteen chirps. In other embodiments, the number of chirps in frame 1658 may be greater or fewer, such as between one and one hundred. The number of chirps present within frame 1658 may be determined based upon the average power that is to be radiated. By limiting the number of chirps within frame 1658 prior to an inter-frame pause, the average output power may be limited. In some embodiments, the peak power radiated by a radar subsystem may be 13 dBm, 7 dBm, 5 dBm. In other embodiments, the peak power radiated may be greater than 13 dBm or less than 5 dBm. That is, at any given time, the amount of power radiated by the radar subsystem never exceeds such values.

The number of chirps and the rate at which chirps are repeated in a frame can be adjusted based on velocity detection requirements of the device. The number of chirps per frame and the frame repetition rate can be used to limit the on time of RF transmissions, which reduces the power consumption of the product. A reduced power mode may be used until an event is detected, and then power consumption may be increased to send more chirps to collect more data to better assess the environment. The more chirps transmitted can result in more data collected, which can in some cases be averaged or analyzed to obtain a higher signal to noise reading of the data.

The FCC or other regulatory agency may set a maximum amount of power that is permissible to be radiated into an environment on average. For example, a duty cycle requirement may be present that limits the duty cycle to less than 10% for any 33 ms time period. In one particular example in which there are twenty chirps per frame, each chirp can have a duration of 128 us, and each frame being 33.33 ms in duration. The corresponding duty cycle is (20 frames)* (0.128 ms)/(33.33 ms), which is about 7.8%. By limiting the number of chirps within frame 258 prior to an inter-frame pause, the total amount of power output may be limited. In some embodiments, the peak EIRP (effective isotropically radiated power) may be 13 dBm (20 mW) or less, such as 12.86 dBm (19.05 mW). In other embodiments, the peak EIRP is 15 dBm or less and the duty cycle is 15% or less. In some embodiments, the peak EIRP is 20 dBm or less. That is, at any given time, the average power radiated over a period of time by the radar subsystem might be limited to never exceed such values. Further, the total power radiated over a period of time may be limited. In some embodiments, a duty cycle is not be required.

Frames may be transmitted at a frequency of 5-10 Hz as shown by time period 1660. In other embodiments, the frequency may be higher or lower. The frame frequency may be dependent on the number of chirps within a frame and the duration of inter-frame pause 1662. For instance, the frequency may be between 1 Hz and 50 Hz. In some embodiments, chirps may be transmitted continuously, such that the radar subsystem outputs a continuous stream of chirps interspersed with inter-chirp pauses. Inter-frame pause 1662 represents a period of time when no chirps are output. In some embodiments, inter-frame pause 1662 is significantly longer than the duration of frame 1658.

In the illustrated embodiment of FIG. 16, a single frame 1658 and the start of a subsequent frame are illustrated. It should be understood that each subsequent frame can be structured similarly to frame 1658. Further, the transmission mode of the radar subsystem may be fixed. That is, regardless of whether a user is present or not, the time of day, or other factors, chirps may be transmitted according to chirp timing diagram 1600. Therefore, in some embodiments, the radar subsystem always operates in a single transmission mode, regardless of the state of the environment (e.g., whether likely occupied, not occupied, or occupants are likely asleep or not). A continuous train of frames similar to frame 1658 may be transmitted while the thermostat is powered on.

In some embodiments, the radar sensor is not be powered if the batteries are low on power and/or no C-wire is connected with the thermostat. In such embodiments, the thermostat may operate in a touch-to-activate mode in which a user is required to touch the touch sensor in order to activate a display of the thermostat. When touched, the thermostat may default to an interface such as presented in FIGS. 7-9.

Figure 17:
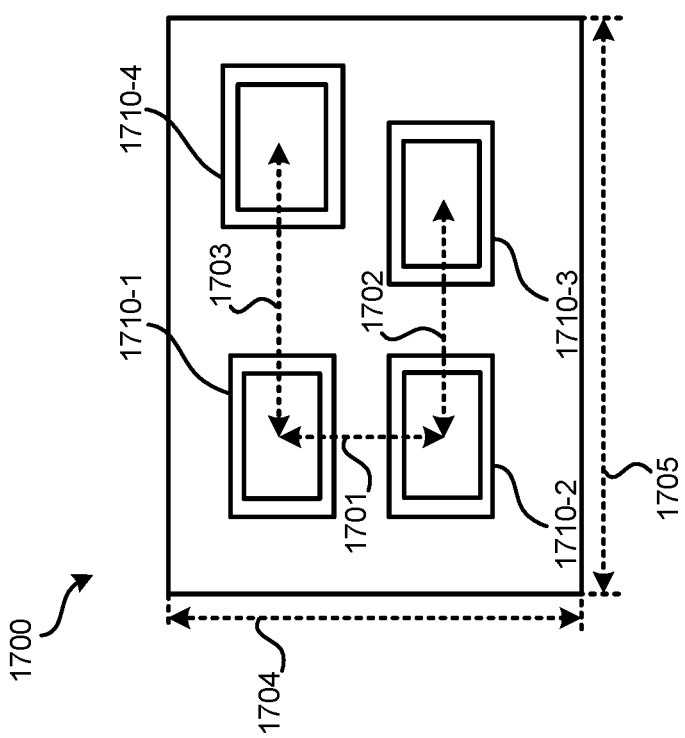
FIG. 17 illustrates an embodiment of a radar sensor that may be used by a thermostat.

FIG. 17 illustrates an embodiment of a radar sensor 1700 that may be used by a thermostat. Radar sensor 1700 may represent an embodiment of radar sensor 613 and the other embodiments of radar sensors. The entirety of the radar sensor can be a single integrated circuit. The entire IC may have dimensions of 6.5 mm (length 1705) by 5 mm (width 1704). In other embodiments, the entire IC has a length 1705 by width 1704 of between 7 mm by 7 mm and 4 mm by 4 mm. The illustrated embodiment of radar subsystem 205 has three receive antennas and one transmit antenna, but other embodiments may have a greater or fewer number of antennas. Radar sensor 1700 may have receive antennas 1710-1, 1710-2, and 1710-3 distributed in an "L" pattern. That is, antennas 1710-1 and 1710-2 may be aligned on axis 1701 and antennas 1710-2 and 1710-3 may be aligned on axis 1702 which is perpendicular to axis 1701, as illustrated in FIG. 17. The center of antenna 1710-2 may be located 2.5 mm or less from the center of antenna 1710-1. The center of antenna 1710-2 may be located 2.5 mm or less from the center of antenna 1710-3.

Transmit antenna 1710-4 may be arranged separately from the L-shaped pattern of the receive antennas 1710-1, 1710-2, and 1710-3. That is, in some embodiments, a center of transmit antenna 1710-4 is not be located on an axis with antenna 1710-3 that is parallel to axis 1701. In some embodiments, transmit antenna 1710-4 is on axis 1703 with center of antenna 1710-1, with axis 1703 being parallel to axis 1702.

Each of antennas 1710 may be hollow rectangular dielectric resonance antennas (DRAs). Each of antennas 1710 may have a same set of dimensions. Alternatively, each of receive antennas 1710-1, 1710-2, and 1710-3 may have the same dimensions and transmit antenna 1710-4 may vary in dimensions from the receive antennas. In some embodiments, transmit antenna 1710-4 has a larger width, such as 0.2 mm larger, than receive antennas 1710-1, 1710-2, and 1710-3, but the same length.

In such an arrangement, the phase delay introduced by applied weights between the antenna data stream of antenna 1710-1 and the data stream of antenna 1710-2 may affect the vertical direction of the receive beam and the phase delay introduced by weights between the antenna data stream of antenna 1710-2 and data stream of antenna 1710-3 may affect the horizontal direction of the receive beam (assuming the radar subsystem integrated circuit is present within the contactless sleep tracking device in approximately the same orientation). For instance, beam steering may be performed to deemphasize moving objects in the direction of the floor (e.g., more than 0°, 5°, 10°, or some other angle below horizontal) to decrease false detection of a user (e.g., due to a pet).

In some embodiments, separate antennas are used for transmitting and receiving. For example, antenna 1710-4 may be used exclusively for transmitting, while antennas 1710-1, 1710-2, and 1710-3 are used exclusively for receiving.

In some embodiments, antenna 1710-3 may be deactivated, such as to save power. Therefore, despite three receive antennas being present, waveform data streams may only be output for antennas 1710-1 and 1710-2. These two antennas may be understood to be vertically aligned such that when the thermostat is installed on a wall, antenna 1710-1 is directly above antenna 1710-2. Such vertically-aligned receive antennas can allow beam steering to be performed vertically, such as to avoid areas near the ground where a pet might reside.

Figure 18:
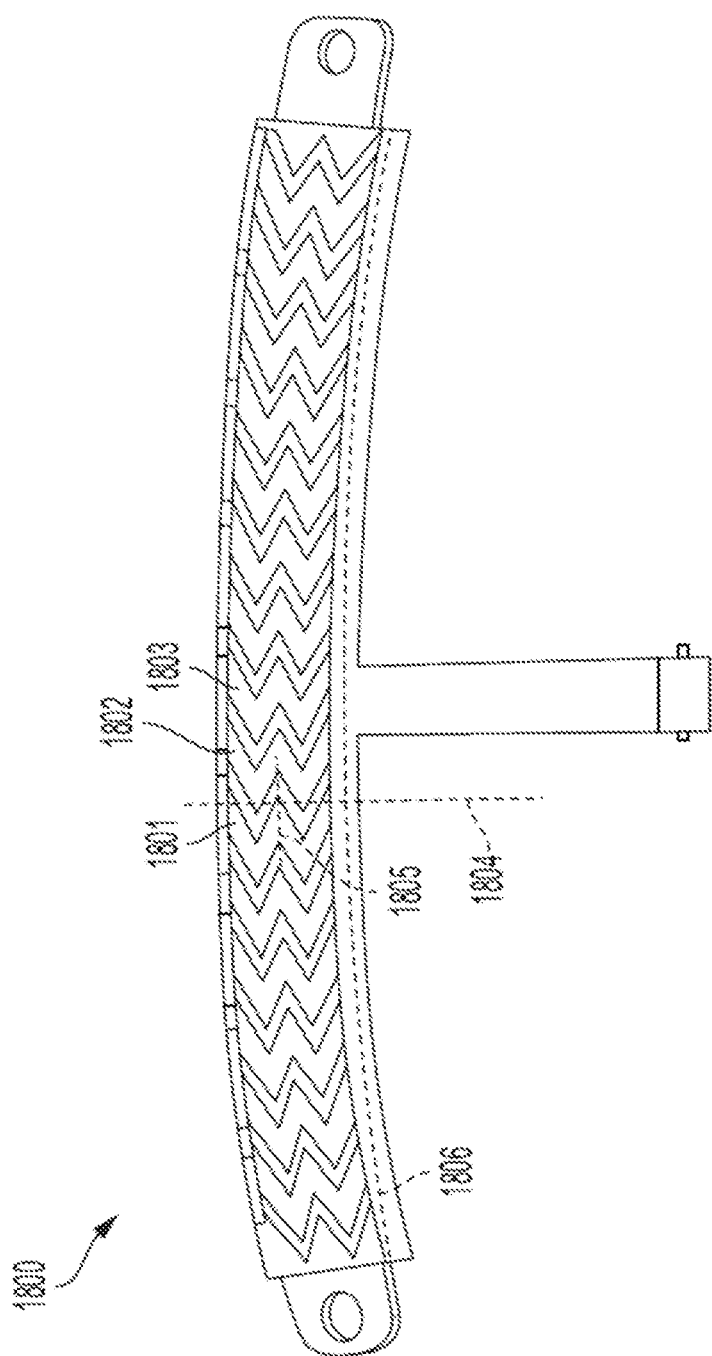
FIG. 18 illustrates an embodiment of a touch strip.

FIG. 18 illustrates an embodiment of a touch strip 1800. Touch strip 1800 may be used as touch sensor 612 of FIG. 6. Touch strip 1800 may be affixed to an inside of housing 621 such that a user can provide input via the user's finger moving along an exterior sidewall of housing 621 opposite the interior portion of housing 621 to which touch strip 1800 is attached. Touch strip 1800 may be curved (as indicated by arc 1806) along a length of touch strip 1800 to allow touch strip 1800 to be flexed in an arc and lay flat against the interior of a sidewall of housing 621. The sidewall of housing 621 may have a radius that varies in length between the thermostat's cover and a back of housing 621 that attaches with a backplate or mounts to a wall. Thus, the curvature indicated by arc 1806 can help touch sensor 1800 make contact with the interior surface of the sidewall.

Touch strip 1800 can include multiple electrodes. For example, 16 electrodes may be present. In other embodiments, greater (e.g., 20, or 20 or more electrodes) or fewer numbers of electrodes (e.g., 4, 6, 8, or fewer electrodes) are present. For simplicity in FIG. 18, only three electrodes are labeled: electrode 1801, electrode 1802, and electrode 1803.

The electrodes of touch strip 1800 may be shaped in a "Z" or in zig-zag pattern. More generally, two electrodes, such as electrodes 1801 and 1802, can intersect an axis 1804 that is generally perpendicular to the length of touch strip 1800, as indicated by axis 1805. By having regions that overlap along a perpendicular axis, when a user moves their finger along touch strip 1800, the user's finger will be detected across multiple electrodes. For instance, as the user slides his finger from left to right across electrodes 1801 and 1802, capacitive measurements obtained from electrode 1801 will decrease while capacitive measurements obtained from electrode 1802 will increase. By having overlap along axis 1804, the decrease and increase in measurements between adjacent electrodes can be more gradual as the user swipes their finger. By having the increase and decrease in measurements be more gradual as the user's finger slides, the processing system of the thermostat can resolve finer movements of the user's finger (or fingers). This finer movement can be translated by the processing system into more precise and/or finer movements among setpoint temperatures and/or scrolling within menus of the thermostat interface.

Figure 19:
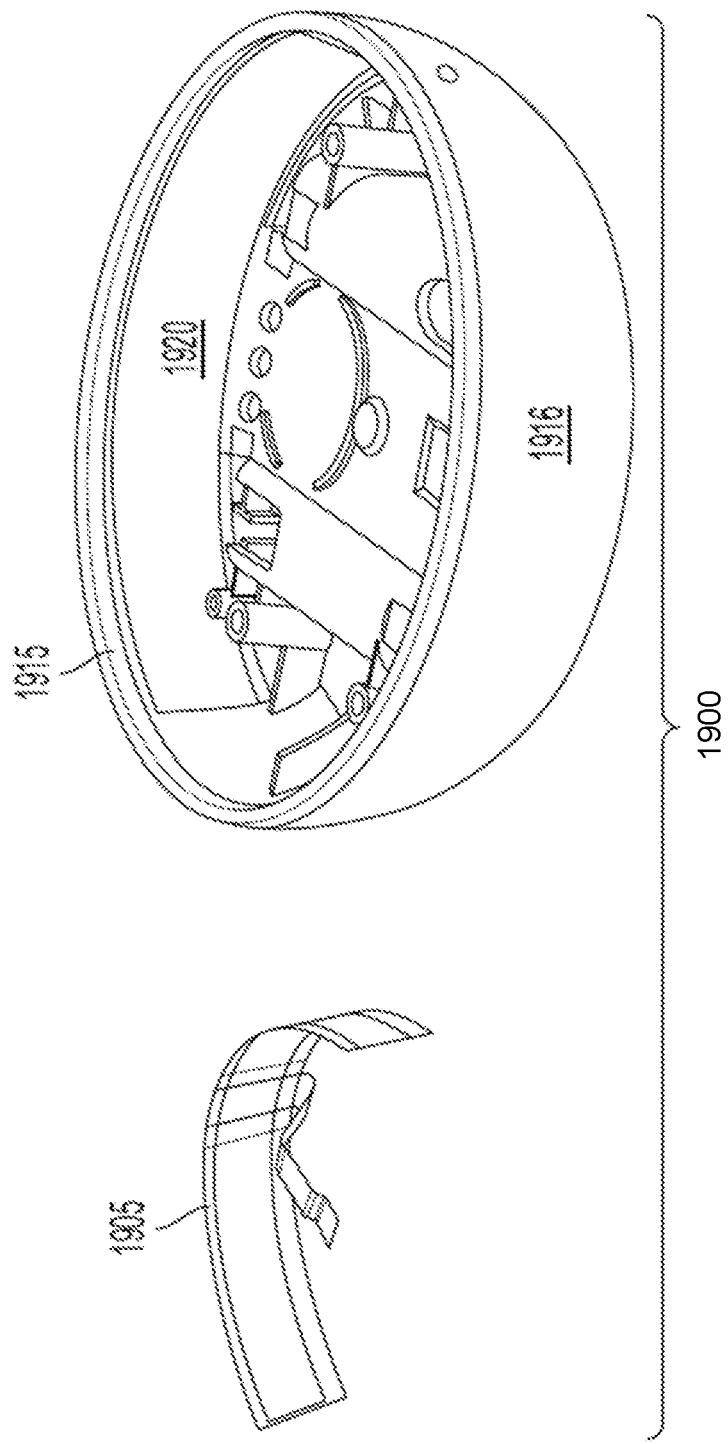
FIG. 19 illustrates an embodiment of a touch strip flexed in an arc for mounting to an interior surface of a thermostat housing.

FIG. 19 illustrates an embodiment 1900 of touch strip 1905 flexed in an arc for mounting to an interior surface of housing 1915. Housing 1915 can represent housing 621 of FIG. 6 or any other housing detailed herein. Touch strip 1905 can represent touch sensor 612, touch strip 1800, or any other touch strip detailed herein. To mount to interior surface 1920, touch strip 1905 may be flexed in an arc and attached with interior surface 1920, which represents an interior surface of housing 1915 along the sidewall. Touch strip 1905 may be attached using an adhesive and may remain generally in the shape of an arc. Since the radius of sidewall 1916 varies from a front (where a cover would be located) of housing 1915 to a back, the curvature of touch strip 1905, represented by arc 1806 in FIG. 18, can allow touch strip 1905 to be situated flat against interior surface 1920.

Figure 20:
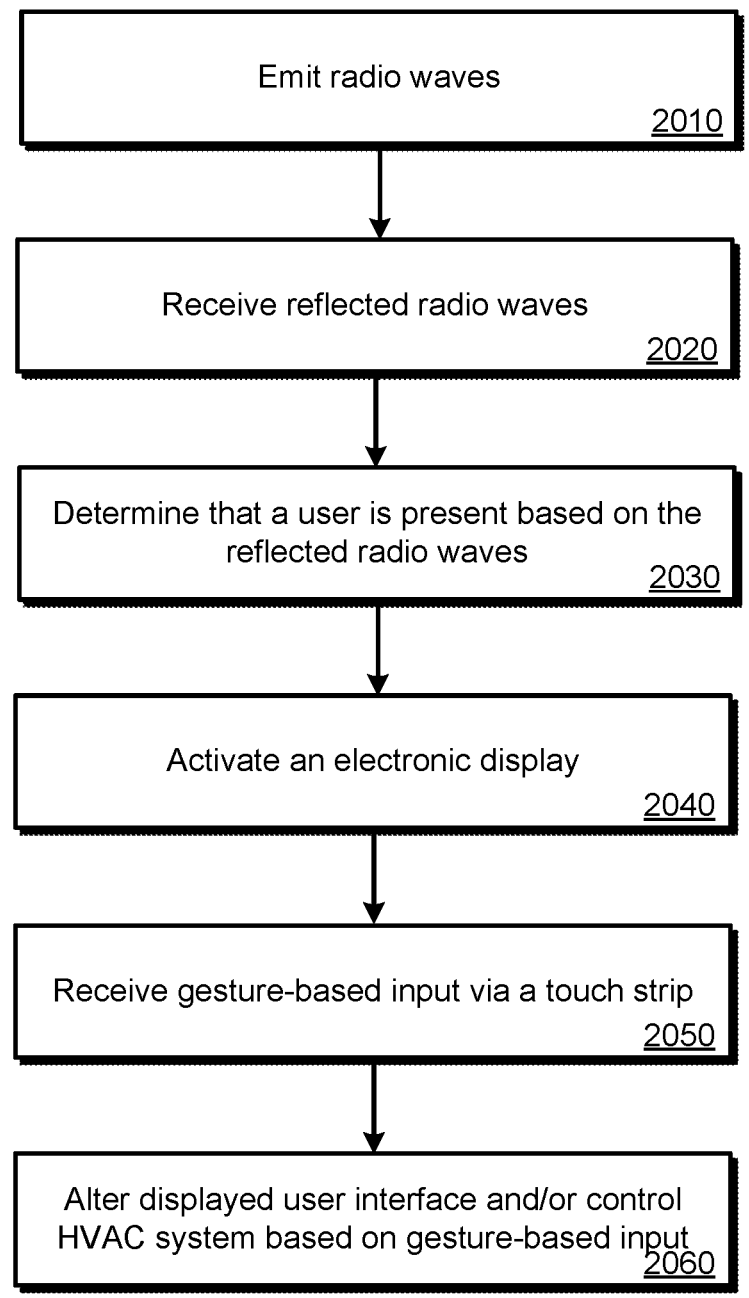
FIG. 20 illustrates an embodiment of a method for interacting with a smart thermostat.

Various methods may be performed using the systems, devices, components, and interfaces detailed in reference to FIGS. 1-19. FIG. 20 illustrates an embodiment of a method 2000 for interacting with a smart thermostat. The thermostat used to perform method 2000 can be the thermostat embodiments detailed in relation to FIGS. 1-19. At block 2010, radio waves are emitted by a radar sensor. The radar emitted may be FMCW radar. Radar chirps can be emitted as detailed in relation to FIG. 16. The radar may be emitted through a visually reflective cover of the thermostat in the ambient environment of the thermostat.

At block 2020, radio waves are reflected off of moving and stationary objects and reflected back toward the thermostat. The radar sensor can receive the reflected radio waves through the visually-mirrored cover. This cover can be non-metallic to prevent reflection of emitted radio waves and radio waves reflected by objects in the ambient environment.

At block 2030, a determination of whether a user is present may be at least partially based on the reflected radio waves received by the radar sensor at block 2020. In some embodiments, block 2030 additionally or alternatively involves detecting whether the user is moving toward or away from the radar sensor, the distance at which the user is located, and/or a velocity at which the user is moving.

At block 2040, an electronic display may be activated such that information is presented and visible by the user in response to detection of the user at block 2030 (and/or the user's distance, direction, and/or velocity). The electronic display may present a user interface such as present in FIG. 7 or any other default user interface, such as presented in FIGS. 8-10, or some other default user interface.

At block 2050, the user may interact with the thermostat via a touch sensor, such as a touch strip. The user interface presented is altered in response to the user performing a gesture on the touch strip. The gesture could be a tap gesture, a swipe upward gesture, a swipe downward gesture, or a touch-and-hold gesture. Other gestures may also be possible. Input provided via the touch strip may be used to alter the presented user interface and/or control operation of the thermostat at block 2060. For example, a user can provide input via the touch strip that activates an HVAC system, deactivates an HVAC system, adjusts a control schedule used to control the HVAC system, adjust a setpoint of the HVAC system, alters settings of the thermostat, etc.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A smart home device, comprising:
a housing;
a wireless network interface housed by the housing;
an electronic display, housed by the housing, that outputs a plurality of colors;
a processing system comprising one or more processors housed by the housing, wherein the processing system is in communication with the wireless network interface and the electronic display;
a cover, housed by the housing, through which the electronic display is visible, wherein the cover comprises:
a glass layer, wherein the glass layer is the outermost layer of the cover that is adjacent an ambient environment of the smart home device; and
an optical coating layer, deposited directly onto a surface of the glass layer, that comprises a plurality of sublayers, wherein:
the optical coating layer comprises alternating non-metallic oxide layers having different refractive indexes;
the plurality of sublayers vary in thickness such that the optical coating layer reflects light incident on the optical coating layer from the ambient environment through the glass layer at a first plurality of wavelengths; and
the optical coating layer permits a second plurality of wavelengths of light to be transmitted; and
a non-transitory processor-readable medium that stores a display color settings profile that corresponds to a tint of the cover, wherein the processing system adjusts color output by the electronic display based on the display color settings profile.

2. The smart home device of claim 1, wherein the cover further comprises an optically clear adhesive layer directly attached to the optical coating layer.

3. The smart home device of claim 2, wherein:
the cover further comprises an anti-shatter layer directly attached to the optical coating layer; and
in response to an impact that breaks the glass layer, the anti-shatter layer remains attached with multiple pieces of the broken glass layer.

4. The smart home device of claim 2, wherein the optical coating layer comprises less than fifteen non-metallic sublayers.

5. The smart home device of claim 4, wherein a thickness of each sublayer of the plurality of sublayers of the optical coating layer is between 10 nm and 110 nm.

6. The smart home device of claim 1, further comprising an ambient light sensor, housed by the housing, that receives light from the ambient environment through the cover, wherein:
the processing system is configured to adjust a brightness of the electronic display based on an amount of ambient light sensed by the ambient light sensor through the cover and a stored ambient light tint correction profile; and the stored ambient light tint correction profile is selected from a plurality of stored ambient light tint correction profiles based upon the tint of the cover.

7. The smart home device of claim 1, wherein the smart home device is a thermostat and the thermostat further comprises one or more temperature sensors, housed by the housing, in communication with the processing system.

8. The smart home device of claim 1, wherein the cover further comprises a masking layer, wherein:

the masking layer of the cover is adjacent an interior of the smart home device; and the masking layer is shaped to allow light emitted by the electronic display to pass through the cover and block light from being reflected by other components of the smart home device from passing through the cover.

9. A method for manufacturing a cover for a smart home device, the method comprising:

performing a vapor deposition process to deposit an optical coating layer directly onto a glass layer, wherein:

the optical coating layer comprises a plurality of sublayers; and the plurality of sublayers vary in thickness and refractive indexes such that the optical coating layer reflects light at a plurality of wavelengths incident on the cover from the ambient environment;

bonding an anti-shatter layer with an optically clear adhesive layer;

attaching the bonded anti-shatter layer and optically clear adhesive layer with the deposited optical coating layer;

installing the cover within a housing of the smart home device; and activating a display color settings profile that corresponds to a tint of the cover, wherein a processing system of the smart home device adjusts color output by an electronic display of the smart home device based on the display color settings profile.

10. The method for manufacturing the cover for the smart home device of claim 9, the method further comprising:

attaching a masking layer with the bonded anti-shatter layer, wherein the masking layer is shaped to allow light emitted by the electronic display of the smart home device to pass through the cover and prevent light from being reflected back through the cover by other components of the smart home device.

11. The method for manufacturing the cover for the smart home device of claim 9, wherein the optical coating layer comprises alternating oxide layers having different refractive indexes.

12. The method for manufacturing the cover for the smart home device of claim 11, wherein the optical coating layer comprises less than fifteen sublayers.

13. The method for manufacturing the cover for the smart home device of claim 12, wherein a thickness of each sublayer of the plurality of sublayers of the optical coating layer is between 10 nm and 110 nm.

14. A smart home device, comprising:
a housing;
a wireless network interface housed by the housing;
an electronic display, housed by the housing, that outputs a plurality of colors;
a processing system comprising one or more processors housed by the housing, wherein the processing system is in communication with the wireless network interface and the electronic display;
a cover, housed by the housing, through which the electronic display is visible, wherein the cover comprises:
a glass layer, wherein the glass layer is the outermost layer of the cover that is adjacent an ambient environment of the smart home device;
a transparent colored film;
a mirrored film, directly attached with the transparent colored film, that comprises a plurality of sublayers, wherein:
the transparent colored film is located between the glass layer and the mirrored film; and
the plurality of sublayers vary in thickness and refractive indexes such that the mirrored film reflects light at a plurality of wavelengths incident on the cover from the ambient environment; and
a non-transitory processor-readable medium that stores a display color settings profile that corresponds to the transparent colored film of the cover, wherein the processing system adjusts color output by the electronic display based on the display color settings profile.

15. The smart home device of claim 14, wherein:
the transparent colored film functions as an anti-shatter film; and
the anti-shatter film hold pieces of the glass layer together in response to an impact that breaks the glass layer.

16. The smart home device of claim 14, wherein the transparent colored film is rose tinted or nickel tinted.

17. The smart home device of claim 14, wherein the cover further comprises an optically clear adhesive layer that bonds the transparent colored film with the glass layer.

18. The smart home device of claim 14, further comprising an ambient light sensor, housed by the housing, that receives light from the ambient environment through the cover, wherein:
the processing system is configured to adjust a brightness of the electronic display based on an amount of ambient light sensed by the ambient light sensor through the cover and a predefined ambient light tint correction profile; and
the predefined ambient light tint correction profile is selected from a plurality of predefined ambient light tint correction profiles based upon a tint of the transparent colored film.

19. The smart home device of claim 14, wherein the smart home device is a thermostat and the thermostat further comprises one or more temperature sensors, housed by the housing, in communication with the processing system.

20. The smart home device of claim 1, wherein:
the non-transitory processor-readable medium stores a plurality of display color settings profiles that comprises the display color settings profile;
each display color settings profile of the plurality of display color settings profiles corresponds to a different cover tint; and
the display color settings profile being activated corresponds to the tint of the cover.

* * * * *